United States Patent
Kuroiwa et al.

(10) Patent No.: US 11,317,541 B2
(45) Date of Patent: Apr. 26, 2022

(54) ELECTRONIC COMPONENT MODULE, ELECTRONIC COMPONENT UNIT, AND METHOD FOR MANUFACTURING ELECTRONIC COMPONENT MODULE

(71) Applicant: Murata Manufacturing Co., Ltd., Nagaokakyo (JP)

(72) Inventors: Shinichiro Kuroiwa, Nagaokakyo (JP); Yukihiro Fujita, Nagaokakyo (JP); Tadateru Yamada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 130 days.

(21) Appl. No.: 16/908,779

(22) Filed: Jun. 23, 2020

(65) Prior Publication Data
US 2020/0413570 A1  Dec. 31, 2020

(30) Foreign Application Priority Data

Jun. 27, 2019 (JP) .............................. JP2019-119677

(51) Int. Cl.
*H05K 1/02* (2006.01)
*H05K 7/20* (2006.01)
(Continued)

(52) U.S. Cl.
CPC ....... *H05K 7/20463* (2013.01); *H05K 1/0207* (2013.01); *H05K 1/0209* (2013.01);
(Continued)

(58) Field of Classification Search
CPC ............. H05K 7/20463; H05K 1/0207; H05K 1/0209; H05K 1/181; H05K 3/284;
(Continued)

(56) References Cited

U.S. PATENT DOCUMENTS 6,818,974 B2 * 11/2004 Yokoyama .............. H01L 23/04
  257/676
8,564,121 B2 * 10/2013 Ihara ..................... H01L 23/552
  257/707

(Continued)

FOREIGN PATENT DOCUMENTS

JP  2012-028560 A   2/2012
JP  2012-227472 A  11/2012
(Continued)

OTHER PUBLICATIONS

Official Communication issued in corresponding Korean Patent Application No. 10-2020-0072165, dated Oct. 14, 2021.
(Continued)

*Primary Examiner* — Sherman Ng
(74) *Attorney, Agent, or Firm* — Keating & Bennett, LLP

(57) ABSTRACT

An electronic component module includes a second terminal electrode that is independent of a first terminal electrode in terms of potential. A second electronic component is mounted on a board, with a first surface thereof facing the board. A heat transfer portion is disposed on a second surface of the second electronic component, the heat transfer portion being connected to both the first terminal electrode and the second terminal electrode. A heat dissipation portion is connected to the board via the first terminal electrode, the second terminal electrode, and the heat transfer portion.

20 Claims, 22 Drawing Sheets

(51) Int. Cl.
   *H05K 1/18* (2006.01)
   *H05K 3/28* (2006.01)
   *H05K 3/34* (2006.01)
   *H01L 25/16* (2006.01)

(52) U.S. Cl.
   CPC ............ *H05K 1/181* (2013.01); *H05K 3/284* (2013.01); *H05K 3/3442* (2013.01); *H05K 7/20509* (2013.01); *H01L 25/16* (2013.01); *H05K 2201/1003* (2013.01); *H05K 2201/1006* (2013.01); *H05K 2201/10015* (2013.01); *H05K 2201/10022* (2013.01)

(58) Field of Classification Search
   CPC ............ H05K 3/3442; H05K 7/20509; H05K 2201/10015; H05K 2201/10022; H05K 2201/1003; H05K 2201/1006
   USPC .......................................................... 361/712
   See application file for complete search history.

(56) References Cited

U.S. PATENT DOCUMENTS

2012/0020025 A1   1/2012  Sotome
2017/0256474 A1*  9/2017  Fujinaga ................. H01L 23/12
2020/0118913 A1   4/2020  Matsukawa et al.

FOREIGN PATENT DOCUMENTS

| | | |
|---|---|---|
| JP | 6089713 B2 | 3/2017 |
| JP | 2018-088460 A | 6/2018 |
| WO | 2018/181708 A1 | 10/2018 |
| WO | 2018/235715 A1 | 12/2018 |

OTHER PUBLICATIONS

Official Communication issued in corresponding Japanese Patent Application No. 2019-119677, dated Jan. 4, 2022.

* cited by examiner

ELECTRONIC COMPONENT MODULE, ELECTRONIC COMPONENT UNIT, AND METHOD FOR MANUFACTURING ELECTRONIC COMPONENT MODULE

CROSS REFERENCE TO RELATED APPLICATIONS

This application claims the benefit of priority to Japanese Patent Application No. 2019-119677 filed on Jun. 27, 2019. The entire contents of this application are hereby incorporated herein by reference.

BACKGROUND OF THE INVENTION

1. Field of the Invention

The present invention relates to an electronic component module, an electronic component unit, and a method for manufacturing an electronic component module.

2. Description of the Background Art

Japanese Patent Laid-Open No. 2018-88460, discloses a configuration of an electronic component module. The electronic component module described in Japanese Patent Laid-Open No. 2018-88460 includes a wiring board, electronic components, a sealing resin layer, external terminal electrodes, a first shield layer, and a second shield layer.

The wiring board has one main surface and the other main surface. The electronic components are mounted on the one main surface. The sealing resin layer seals the one main surface and the electronic components. The first shield layer covers the surfaces of the wiring board and the sealing resin layer, except for the surface on which the external terminal electrodes are placed. The second shield layer covers the surface on which the external terminal electrodes are placed, so that the external terminal electrodes are separated.

If the electronic components mounted on the wiring board include a heating element, such as a central processing unit (CPU) or power amplifier, the heat generated by the heating element may adversely affect and deteriorate the electrical characteristics of the heating element itself or other electronic components located near the heating element. The heat has a significant impact if the mounted components are sealed with a resin layer, in particular. In some cases, a heat sink is provided on the top surface of a heating element to transfer and dissipate the heat generated by the heating element. In such cases, however, the heat sink may not be able to fully dissipate the heat because of a large amount of heat generation from the heating element or because of a reduced thickness of the electronic component module. Further, in some cases, a heat sink cannot be placed on the top surface of a heating element, depending on the type of the heating element.

SUMMARY OF THE INVENTION

Preferred embodiments of the present invention provide electronic component modules and methods for manufacturing the same that are able to effectively dissipate the heat generated by a heating element, so as to reduce or prevent the deterioration of the electrical characteristics of the heating element itself or other electronic components located near the heating element, even if a large amount of heat is generated by the heating element, or the electronic component module has a reduced thickness, or a heat sink cannot be placed on the top surface of the heating element. Also, preferred embodiments of the present invention provide electronic component units for use in the electronic component modules and the methods for manufacturing the same.

An electronic component module according to a preferred embodiment of the present invention includes a board, a first electronic component, a second electronic component, a heat transfer portion, and a heat dissipation portion. The first electronic component is a heating element and is mounted on the board. The second electronic component includes a body, a first terminal electrode, and a second terminal electrode. The body includes a first surface and a second surface on an opposite side from the first surface. The first terminal electrode extends continuously from the first surface to the second surface. The second terminal electrode extends continuously from the first surface to the second surface and is independent of the first terminal electrode in terms of potential. The second electronic component is mounted on the board, with the first surface facing the board. The heat transfer portion is disposed on the second surface of the second electronic component, the heat transfer portion being connected to both the first terminal electrode and the second terminal electrode. The heat dissipation portion is connected to the board via the first terminal electrode, the second terminal electrode, and the heat transfer portion.

An electronic component unit according to a preferred embodiment of the present invention includes an electronic component and a heat transfer portion. The electronic component includes a body, a first terminal electrode, and a second terminal electrode. The body includes a first surface and a second surface on an opposite side from the first surface. The first terminal electrode extends continuously from the first surface to the second surface. The second terminal electrode extends continuously from the first surface to the second surface and is independent of the first terminal electrode in terms of potential. The heat transfer portion is disposed on the second surface of the electronic component, the heat transfer portion being connected to both the first terminal electrode and the second terminal electrode, with the first terminal electrode and the second terminal electrode being maintained independent of each other in terms of potential.

A method for manufacturing an electronic component module according to a preferred embodiment of the present invention includes mounting a first electronic component on a board, the first electronic component being a heating element; mounting a second electronic component on the board, the second electronic component including a body including a first surface and a second surface on an opposite side from the first surface, a first terminal electrode extending continuously from the first surface to the second surface, and a second terminal electrode extending continuously from the first surface to the second surface and independent of the first terminal electrode in terms of potential, the second electronic component including a heat transfer portion on the second surface, the heat transfer portion being connected to both the first terminal electrode and the second terminal electrode, the second electronic component being mounted on the board, with the first surface facing the board; and producing a heat dissipation portion connected to the board via the first terminal electrode, the second terminal electrode, and the heat transfer portion.

The above and other elements, features, steps, characteristics and advantages of the present invention will become

DETAILED DESCRIPTION OF THE PREFERRED EMBODIMENTS

Figure 1:
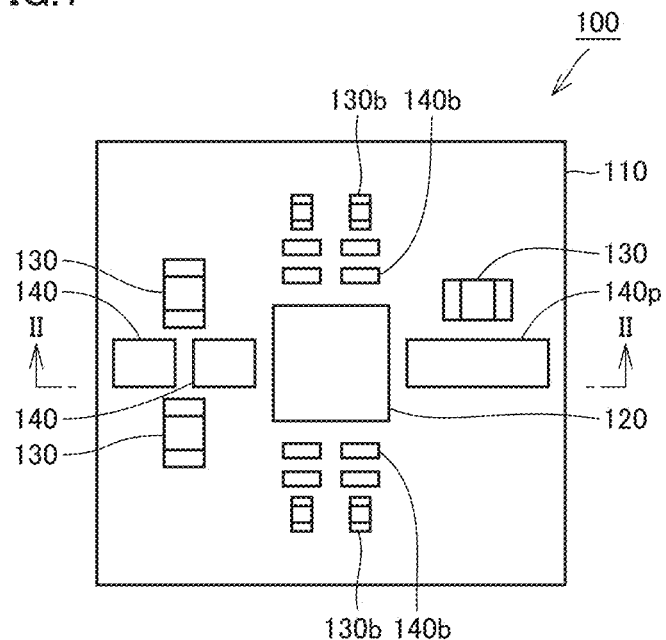
FIG. 1 is a plan view showing a configuration of an electronic component module according to a preferred embodiment 1 of the present invention.

Electronic component modules, electronic component units, and methods for manufacturing an electronic component module in each preferred embodiment of the present invention will now be described with reference to the drawings. In the description of the preferred embodiments below, the same or corresponding portions in the drawings are designated by the same reference signs, and the description of such portion is not repeated.

Preferred Embodiment 1

Figure 2:
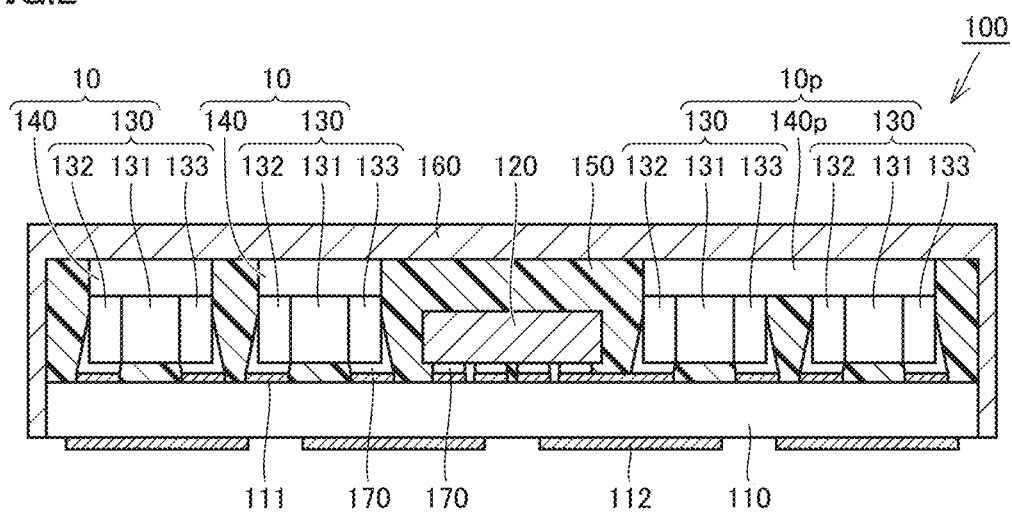
FIG. 2 is a cross-sectional view of the electronic component module in FIG. 1 as seen from the direction indicated by the arrowed line II-II.
Figure 3:
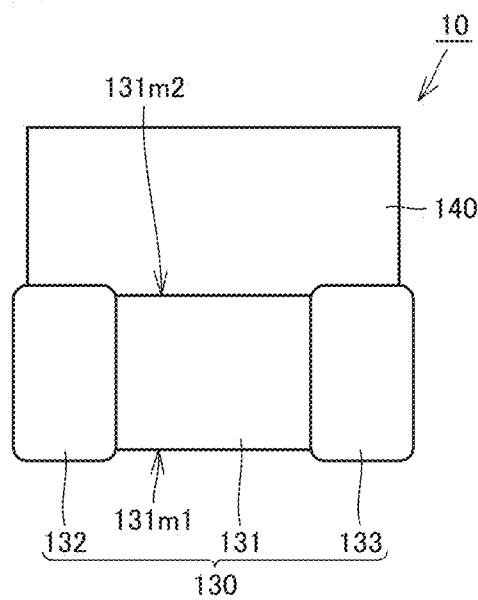
FIG. 3 is a front view showing a configuration of an electronic component unit according to preferred embodiment 1 of the present invention.

FIG. 1 is a plan view showing a configuration of an electronic component module according to a preferred embodiment 1 of the present invention. FIG. 2 is a cross-sectional view of the electronic component module in FIG. 1 as seen from the direction indicated by the arrowed line II-II. FIG. 3 is a front view showing a configuration of an electronic component unit according to preferred embodiment 1 of the present invention.

As shown in FIGS. 1 and 2, an electronic component module 100 according to preferred embodiment 1 of the present invention includes a board 110, a first electronic component 120, second electronic components 130, 130b, a resin portion 150, heat transfer portions 140, 140b, 140p, and a heat dissipation portion 160. FIG. 1 does not show resin portion 150 and heat dissipation portion 160. FIG. 1 shows only some of a plurality of electronic components mounted on board 110. Board 110 is a multi-layer printed circuit board made of, for example, low-temperature co-fired ceramic or glass epoxy resin.

Board 110 includes a plurality of front-side electrodes 111 on one main surface. Board 110 includes a plurality of back-side electrodes 112 on another main surface. Board 110 includes thereinside a ground electrode, a plurality of types of interconnection electrodes, and a plurality of via conductors, none of which is shown. The ground electrode is exposed at a lateral surface of board 110 and electrically connected to heat dissipation portion 160.

Front-side electrodes 111, back-side electrodes 112, the ground electrode, and the interconnection electrodes are preferably made of a highly electrically conductive metal, such as, for example, Cu or Al. The via conductors are preferably made of a highly electrically conductive metal, such as, for example, Ag or Cu. Front-side electrodes 111 and back-side electrodes 112 may be plated with a double layer of Ni and Au, for example.

In the present preferred embodiment, first electronic component 120 and second electronic components 130, 130b are mounted on one main surface of board 110. Specifically, first electronic component 120 and second electronic components 130, 130b are connected to their corresponding front-side electrodes 111 via electrically conductive joint portions 170. Electrically conductive joint portions 170 are preferably made of, for example, lead-free solder.

As shown in FIG. 2, in the present preferred embodiment, first electronic component 120 is electrically connected to second electronic component 130 via a wiring pattern disposed on a surface of board 110. The wiring pattern disposed on a surface of board 110 includes front-side electrodes 111. First electronic component 120 may be electrically connected to second electronic component 130 via a wiring pattern disposed inside board 110. The wiring pattern disposed inside board 110 includes a ground electrode, a plurality of types of interconnection electrodes, and a plurality of via conductors.

In other words, first electronic component 120 may be electrically connected to second electronic component 130 via a wiring pattern disposed on at least one of a surface of and inside board 110. This wiring pattern also defines and functions as a heat transfer path.

First electronic component 120, mounted on board 110, is a heating element that generates heat by its own operation. In the present preferred embodiment, first electronic component 120 is an active component. First electronic component 120 is preferably, for example, a semiconductor integrated circuit (IC) chip, such as a power management IC. Electronic component module 100 may include a plurality of first electronic components 120.

As shown in FIG. 3, second electronic component 130 includes a body 131, a first terminal electrode 132, and a second terminal electrode 133. Body 131 includes a first surface 131$m$1 and a second surface 131$m$2 on the opposite side from first surface 131$m$1.

First terminal electrode 132 extends continuously from first surface 131$m$1 to second surface 131$m$2. First terminal electrode 132 covers the outer surface of one end of body 131 in the longer-side direction. Second terminal electrode 133 extends continuously from first surface 131$m$1 to second surface 131$m$2. Second terminal electrode 133 covers the outer surface of the other end of body 131 in the longer-side direction.

Each of first and second terminal electrodes 132 and 133, having a C shape in cross section, may have any other configuration as long as they extend electrically continuously from first surface 131$m$1 to second surface 131$m$2 so that first surface 131$m$1 and second surface 131$m$2 have the same potential. For example, each of first and second terminal electrodes 132 and 133 may have a configuration such that a front-side electrode on first surface 131$m$1 is connected to a front-side electrode on second surface 131$m$2 with a via conductor extending through body 131. However, first and second terminal electrodes 132 and 133 are preferably end-surface terminal electrodes as described in the present preferred embodiment, which provide excellent properties as a heat transfer path.

As shown in FIGS. 2 and 3, second electronic component 130 is mounted on board 110, with its first surface 131$m$1 facing board 110.

In the present preferred embodiment, second electronic component 130 is a passive component. Second electronic component 130 is preferably, for example, a chip component, such as a chip inductor, a chip capacitor, or a chip resistor, e.g., a multilayer ceramic capacitor. Electronic component module 100 includes a plurality of second electronic components 130.

Second electronic component 130 includes an electronic element embedded in body 131, such as an inductor, a capacitor, or a resistor, for example. The electronic element includes one end connected to first terminal electrode 132 and the other end connected to second terminal electrode 133, thus being connected in series between first and second terminal electrodes 132 and 133. As such, when heat transfer portion 140 is connected to both first and second terminal electrodes 132 and 133 as described later, first and second terminal electrodes 132 and 133 can be maintained independent of each other in terms of potential unless first and second terminal electrodes 132 and 133 are short-circuited through heat transfer portion 140.

Second electronic component 130b is similar in configuration to second electronic component 130 except that second electronic component 130b has a smaller chip size than second electronic component 130. Therefore, the configuration described for second electronic component 130 also applies to second electronic component 130b.

As shown in FIG. 2, resin portion 150 is disposed on board 110 so that at least first electronic component 120 is embedded in resin portion 150. In the present preferred embodiment, resin portion 150 is disposed one main face of board 110. First electronic component 120 and second electronic components 130, 130b are embedded in resin portion 150. Resin portion 150 is made of a resin commonly used as a sealing resin, such as, for example, an epoxy resin. Resin portion 150 has a thermal conductivity of about 0.4 W/m·K or less, for example, about 0.3 W/m·K. If electronic component module 100 includes a metallic casing that encloses board 110, first electronic component 120, second electronic components 130, 130b, heat transfer portions 140, 140b, 140p, and heat dissipation portion 160, then resin portion 150 may not be necessary.

As shown in FIGS. 2 and 3, heat transfer portion 140 is connected to both first and second terminal electrodes 132 and 133. Heat transfer portion 140 includes a highly thermally conductive member higher in thermal conductivity than resin portion 150. If electronic component module 100 includes no resin portion 150, the highly thermally conductive member preferably has a thermal conductivity of higher than about 0.4 W/m·K, which is the upper limit of the range of thermal conductivities of commonly used sealing resins. That is, it is preferable that the highly thermally conductive member is higher in thermal conductivity than commonly used sealing resins.

In the present preferred embodiment, heat transfer portion 140 is made of an electrically insulating resin including a highly thermally conductive, electrically insulating filler. The filler is preferably made of an oxide, such as, for example, $SiO_2$, $BaTiO_3$, or $Al_2O_3$; or a nitride, such as AlN. While these are examples of insulating filler, the filler may include an electrically conductive filler including, for example, silver, copper or the like, the content of which is low enough to ensure insulation between first and second terminal electrodes 132 and 133. The resin is preferably, for example, an epoxy resin. Heat transfer portion 140 preferably has a thermal conductivity of, for example, about 0.8 W/m·K. In the present preferred embodiment, the above-described filler defines and functions as a highly thermally conductive member.

Heat transfer portion 140 is formed by applying, to second electronic component 130, a resin paste that includes the above-described filler, and then hardening it. As a result, as shown in FIGS. 2 and 3, heat transfer portion 140 is in contact with first terminal electrode 132, second terminal electrode 133, and a portion of body 131 that is located between first and second terminal electrodes 132 and 133, on the side of second electronic component 130 opposite from board 110, i.e., on the side of second surface 131m2 of second electronic component 130. That is, heat transfer portion 140 is in contact with first terminal electrode 132, second terminal electrode 133, and second surface 131m2 of body 131.

As shown in FIG. 3, an electronic component unit 10 is provided in which heat transfer portion 140 is disposed on second surface 131m2 of second electronic component 130 such that first and second terminal electrodes 132 and 133 of second electronic component 130 are electrically insulated from each other, i.e., heat transfer portion 140 is connected to both first and second terminal electrodes 132 and 133 such that first and second terminal electrodes 132 and 133 are maintained independent of each other in terms of potential.

Heat transfer portions 140b, 140p are similar in configuration to heat transfer portion 140 except for shape and size. Therefore, the configuration described for heat transfer portion 140 also applies to heat transfer portions 140b, 140p.

Specifically, heat transfer portion 140 has a shape and size corresponding to one second electronic component 130. Heat transfer portion 140 has a rectangular or substantially rectangular parallelepiped shape equal or substantially equal to second electronic component 130 in planar dimensions. Heat transfer portion 140b has a shape and size corresponding to one second electronic component 130b. Regarding the size of second electronic components 130 and 130b, they preferably have a length of not less than about 0.4 mm and not more than about 1.6 mm in the longer-side direction; a width of not less than about 0.2 mm and not more than about 0.8 mm in the shorter-side direction; and a height of not less than about 0.2 mm and not more than about 0.8 mm in the height direction, for example.

Heat transfer portion 140p has a shape and size corresponding to a plurality of second electronic components 130. As shown in FIG. 2, two second electronic components 130 are connected to one heat transfer portion 140p at their first and second terminal electrodes 132 and 133. An electronic component unit 10p is thus provided, in which two or more of the plurality of second electronic components 130 are connected to one heat transfer portion 140p at their first and second terminal electrodes 132 and 133.

For example, electronic component unit 10p is provided by connecting one heat transfer portion 140p to a plurality of small-sized second electronic components 130, each preferably having a length of not more than about 0.6 mm in the longer-side direction, a width of not more than about 0.3 mm in the shorter-side direction, and a height of not more than about 0.3 mm in the height direction. This enables easy handling when small-sized second electronic components 130 are mounted on board 110.

As shown in FIGS. 1 and 2, electronic component units 10, 10p, which are electronic components each including a heat transfer portion, are located near first electronic component 120. That is, the heat transfer paths can be located near the heating element, thus improving the heat dissipation performance of electronic component module 100. If electronic component units 10, 10p located near first electronic component 120 are larger in size than electronic component units 10, 10p remote from first electronic component 120, then a large heat transfer path can be secured near the heating element. In this case, the heat dissipation performance of electronic component module 100 can be further improved. That is, the length and direction of heat transfer path can be controlled by adjusting the positions and arrangement direction of the electronic component units, which have the same or different heat transfer performances.

As shown in FIG. 2, heat dissipation portion 160 is connected to board 110 via first and second terminal electrodes 132 and 133 and heat transfer portions 140, 140p. Heat dissipation portion 160 covers resin portion 150 and heat transfer portions 140, 140b, 140p. In the present preferred embodiment, heat transfer portions 140, 140b, 140p are exposed at the top surface of resin portion 150, so that heat transfer portions 140, 140b, 140p are directly in contact with heat dissipation portion 160.

In the present preferred embodiment, heat dissipation portion 160 is made of an electrically conductive film. Heat dissipation portion 160 is higher in thermal conductivity than resin portion 150. Heat dissipation portion 160 is preferably made of an electrically conductive material, such as Cu, Ag, or Al, for example.

As described above, heat dissipation portion 160 is electrically connected to the ground electrode of board 110. Heat dissipation portion 160 also defines and functions as an electromagnetic shield that prevents electromagnetic waves emitted from an external device from affecting first electronic component 120, second electronic components 130, and interconnection electrodes of electronic component module 100, and that prevents electromagnetic waves from leaking out of electronic component module 100. Heat dissipation portion 160 is not limited to a metallic thin film extending over an area, such as a shield or ground. Instead, for example, heat dissipation portion 160 may be a heat dissipation device, such as metallic fins, a heat sink, a heat pipe, or a cooling fan; or any combination of them.

A method for manufacturing electronic component module 100 in preferred embodiment 1 of the present invention will now be described.

First, board 110 is prepared. On one main surface of board 110, a plurality of front-side electrodes 111 are formed. On the other main surface of board 110, a plurality of back-side electrodes 112 are formed. Inside board 110, a ground electrode, a plurality of types of interconnection electrodes, a plurality of via conductors and the like are formed. Front-side electrodes 111, back-side electrodes 112, the ground electrode, and the interconnection electrodes are formed by printing an electrically conductive paste including metal (e.g., Cu or Al) on board 110 by, for example, screen printing. The via conductors are formed by creating via holes in board 110 by, for example, laser, and then filling the via holes with conductor by any of well-known methods.

Figure 4:
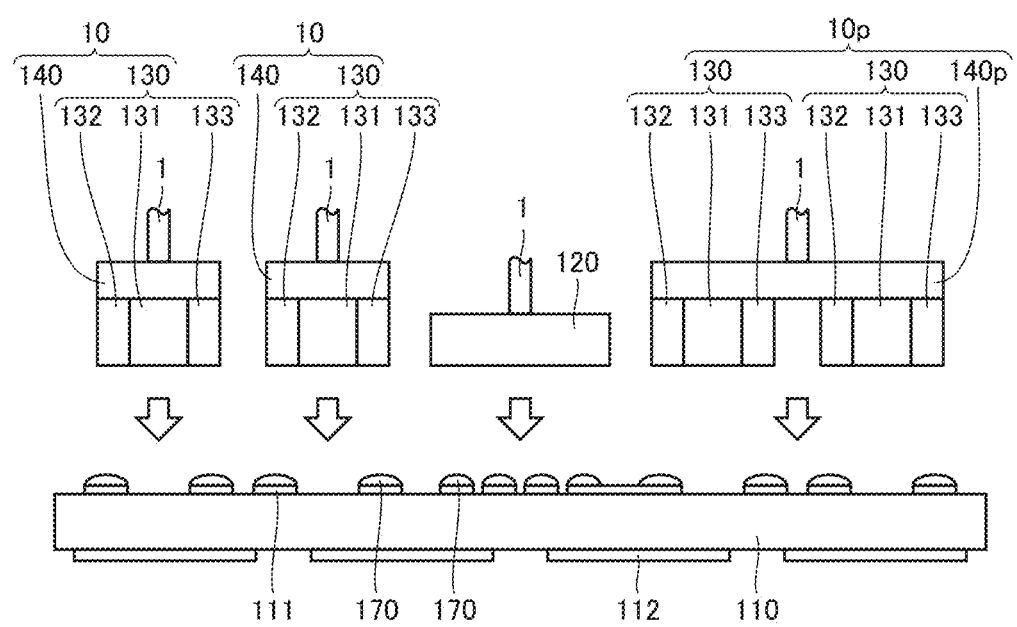
FIG. 4 is a side view showing a state in which first and second electronic components are being mounted on one main surface of a board in a method for manufacturing an electronic component module according to preferred embodiment 1 of the present invention.

Then, first electronic component 120 and second electronic components 130 including heat transfer portions 140 are mounted on one main surface of board 110. FIG. 4 is a side view showing a state in which first and second electronic components are being mounted on one main surface of a board in a method for manufacturing an electronic component module in preferred embodiment 1 of the present invention. FIG. 4 shows a portion corresponding to only one electronic component module 100. However, the components of a plurality of electronic component modules 100 may be provided on the same board first, and then the board may be cut into electronic component module 100 pieces.

As shown in FIG. 4, electrically conductive joint portions 170, such as solder cream, for example, are disposed on the upper surfaces of the plurality of front-side electrodes 111. First electronic component 120 is disposed on corresponding front-side electrodes 111, with the surface of first electronic component 120 on the opposite side from board 110 being sucked and held by a pickup nozzle 1 of a pick-and-place machine.

Before second electronic components 130 are mounted on board 110, heat transfer portions 140 are provided on second electronic components 130. Heat transfer portions 140 each include a highly thermally conductive member. Heat transfer portion 140 is connected to both first and second terminal electrodes 132 and 133. As shown in FIG. 3, heat transfer portion 140 faces second surface 131m2 of body 131.

As shown in FIG. 4, one heat transfer portion 140 is provided on one second electronic component 130 to form electronic component unit 10. One heat transfer portion 140p is provided over a plurality of second electronic components 130 to form electronic component unit 10p.

Electronic component unit 10 is disposed on corresponding front-side electrodes 111, with the surface of heat transfer portion 140 on the opposite side from second electronic component 130 being sucked and held by pickup nozzle 1 of a pick-and-place machine. Electronic component unit 10p is disposed on corresponding front-side electrodes 111, with the surface of heat transfer portion 140p on the opposite side from second electronic component 130 being sucked and held by pickup nozzle 1 of a pick-and-place machine. In this way, as shown in FIGS. 3 and 4, each second electronic component 130 is mounted on board 110, with first surface 131m1 of body 131 facing board 110.

Figure 5:
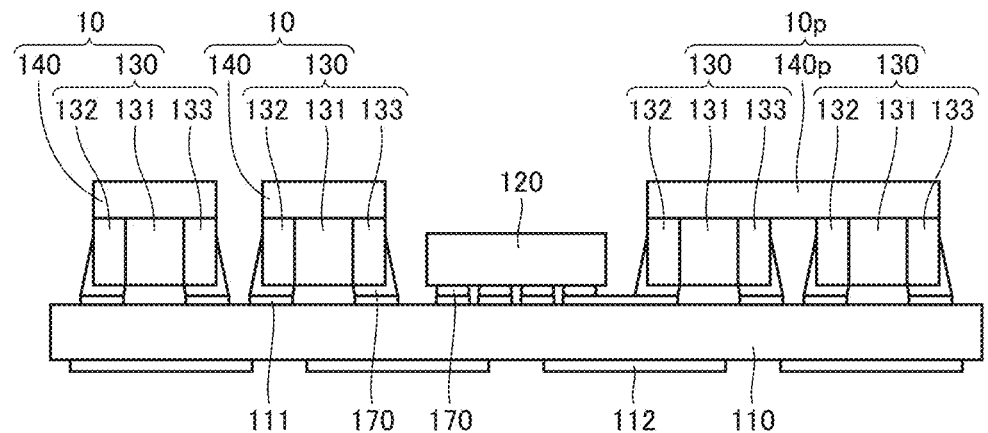
FIG. 5 is a side view showing a state in which the first and second electronic components have been mounted on one main face of the board in the method for manufacturing an electronic component module according to preferred embodiment 1 of the present invention.

FIG. 5 is a side view showing a state in which the first and second electronic components have been mounted on one main surface of the board in the method for manufacturing an electronic component module in preferred embodiment 1 of the present invention. By a heating process, such as a reflow, for example, first and second electronic components 120 and 130 are mounted on one main face of board 110, as shown in FIG. 5.

Figure 6:
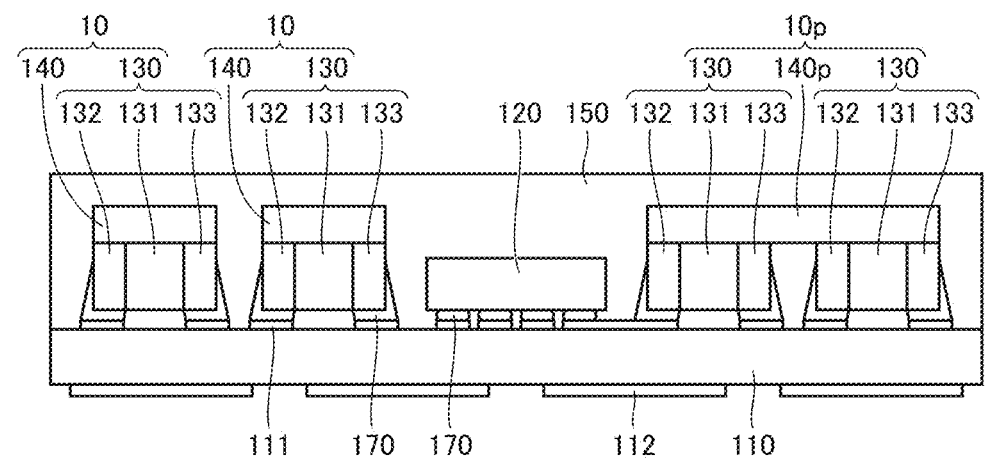
FIG. 6 is a side view showing a state in which a resin portion has been provided on one main surface of the board in the method for manufacturing an electronic component module according to preferred embodiment 1 of the present invention.

FIG. 6 is a side view showing a state in which a resin portion has been provided on one main surface of the board in the method for manufacturing an electronic component module according to preferred embodiment 1 of the present invention. Resin (e.g., epoxy resin) in the form of liquid, powder, or sheet is placed on one main surface of board 110 and then hardened, thus forming resin portion 150. Resin portion 150 may be formed by, for example, coating, printing, compression molding, or transfer molding.

In order to adjust the thermal expansion coefficient of resin portion 150 to close to the thermal expansion coefficient of first and second electronic components 120 and 130, the resin may include inorganic filler, such as silica, for example. This can reduce or prevent the occurrence of peeling of resin portion 150 from first and second electronic components 120 and 130. The inorganic filler also contributes to the improvement in thermal conductivity of resin portion 150. Note that, however, in order to make a significant improvement in heat transfer performance of resin portion 150 by the inorganic filler alone, an extremely high content of inorganic filler is required. However, from the viewpoint of the balance with other properties, such as the fluidity of resin portion 150, it is difficult to improve the heat transfer performance of resin portion 150 enough by increasing the content of inorganic filler alone.

As shown in FIG. 6, resin portion 150 is provided so that first electronic component 120 mounted on board 110 is embedded in resin portion 150. In the present preferred embodiment, resin portion 150 is provided so that electronic component units 10 and 10p are also embedded in resin portion 150. Resin portion 150 is lower in thermal conductivity than the highly thermally conductive member included in each heat transfer portion 140. In the present preferred embodiment, first, resin portion 150 has a greater height than heat transfer portion 140.

Figure 7:
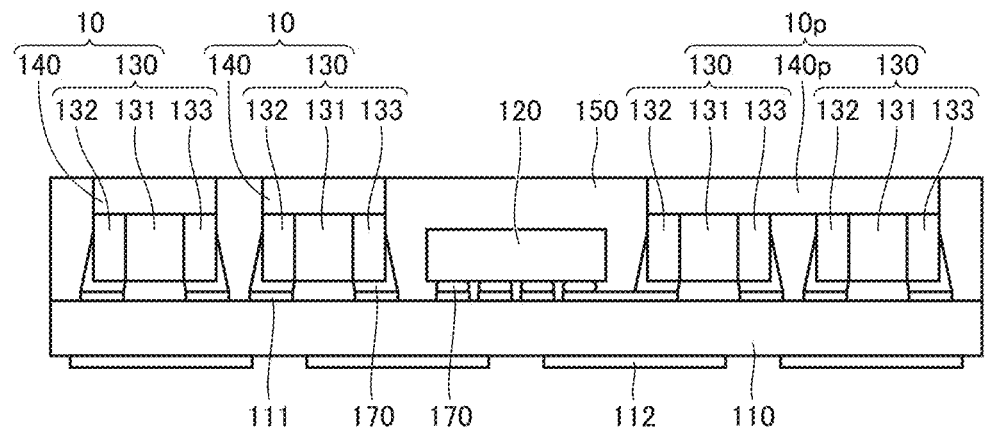
FIG. 7 is a side view showing a state in which the resin portion has been ground from the opposite side from the board in the method for manufacturing an electronic component module according to preferred embodiment 1 of the present invention.

FIG. 7 is a side view showing a state in which the resin portion has been ground from the opposite side from the board in the method for manufacturing an electronic component module according to preferred embodiment 1 of the present invention. As shown in FIG. 7, resin portion 150 is ground with a grinder from the opposite side from board 110. In the present preferred embodiment, a portion of heat transfer portions 140, 140p is also ground along with resin portion 150.

By providing resin portion 150 having a greater height than heat transfer portion 140 and then grinding resin portion 150 from the opposite side from board 110, heat transfer portion 140 of electronic component unit 10 and heat transfer portion 140p of electronic component unit 10p are exposed through resin portion 150. Grinding a portion of heat transfer portions 140, 140p along with resin portion 150 further ensures the exposure of heat transfer portions 140, 140p through resin portion 150 and also allows reduction in the thickness of heat transfer portions 140, 140p, thus reducing the thermal resistance of heat transfer portions 140, 140p.

Then, board 110 is cut into pieces corresponding to electronic component modules 100 by, for example, dicing.

After that, heat dissipation portion 160 is formed by applying electrically conductive paste or evaporating electrically conductive material or sputtering with electrically conductive material, so that heat dissipation portion 160 covers resin portion 150 and heat transfer portions 140, 140p. Thus, as shown in FIG. 2, heat dissipation portion 160 is formed to be connected to board 110 via first and second terminal electrodes 132 and 133 and heat transfer portions 140, 140p. Heat dissipation portion 160 is higher in thermal conductivity than resin portion 150.

Through the processes described above, electronic component module 100 is manufactured as shown in FIG. 2.

Figure 8:
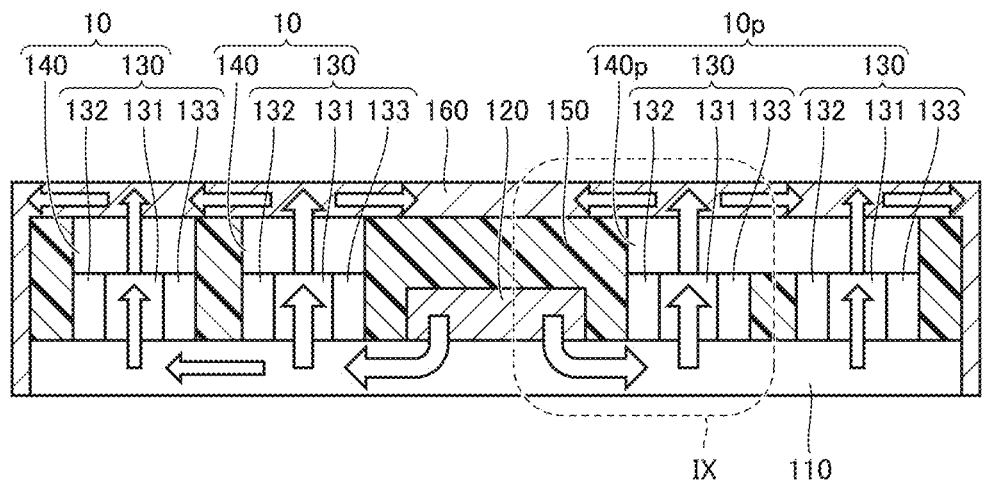
FIG. 8 is a cross-sectional view showing a heat transfer path in the electronic component module according to preferred embodiment 1 of the present invention.
Figure 9:
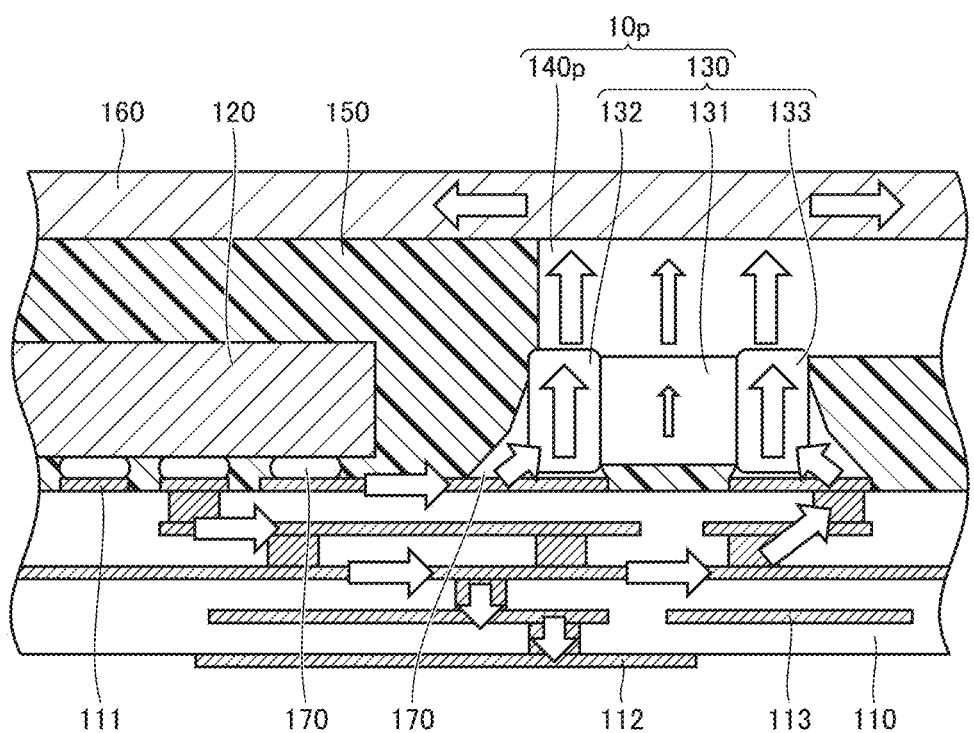
FIG. 9 is an enlarged cross-sectional view of area IX in FIG. 8.

FIG. 8 is a cross-sectional view showing a heat transfer path in the electronic component module in preferred embodiment 1 of the present invention. FIG. 9 is an enlarged cross-sectional view of area IX in FIG. 8. FIG. 8 shows a cross section taken at the same position as FIG. 2. Some portions of electronic component module 100 are not shown. The arrows in FIGS. 8 and 9 indicate the heat transfer path, and the thickness of arrows indicate the amount of transferred heat.

As shown in FIGS. 8 and 9, the heat generated by first electronic component 120 (i.e., a heating element) is transferred to second electronic components 130 via the wiring pattern on a surface of board 110 and via wiring pattern 113 inside board 110. A portion of the heat is transferred to back-side electrodes 112 via wiring pattern 113 inside board 110. The heat transferred to second electronic components 130 is then transferred to heat transfer portions 140, 140p mainly through first and second terminal electrodes 132 and 133 which are higher in thermal conductivity than bodies 131. The heat transferred to heat transfer portions 140, 140p is then transferred to heat dissipation portion 160 to be dissipated to the air. A portion of the heat transferred to second electronic components 130 passes through bodies 131 to heat transfer portions 140, 140p.

The contribution of the heat transfer portions to the heat dissipation performance of the electronic component module was examined by simulation. The simulation analysis results will now be described.

Figure 10:
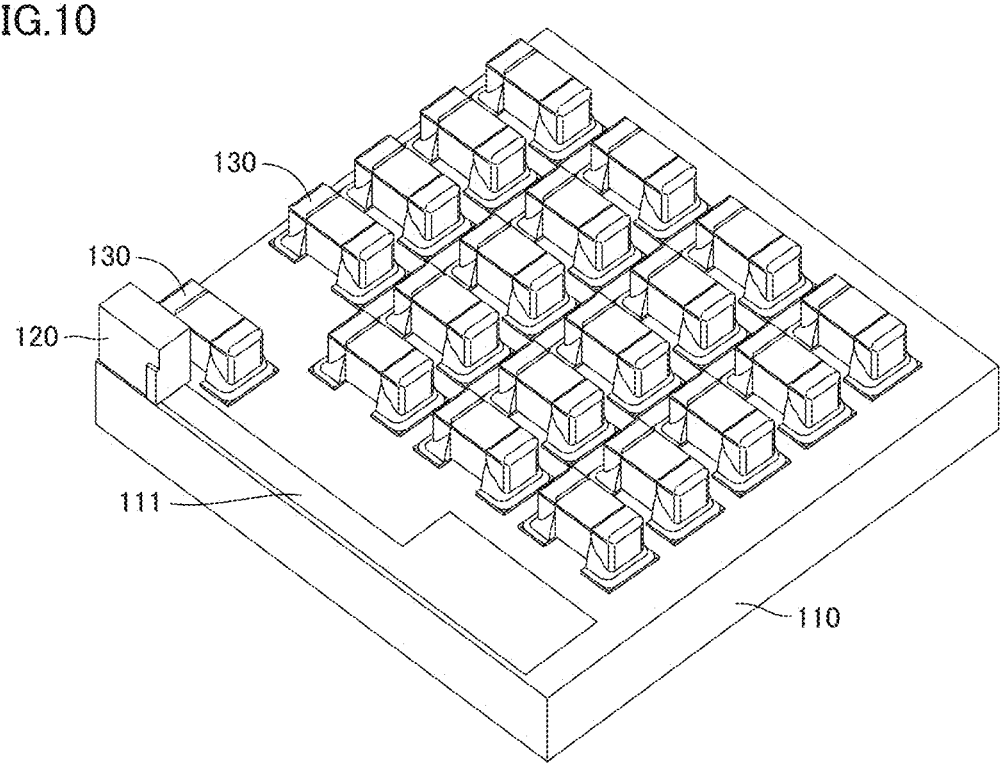
FIG. 10 is a perspective view showing a configuration of an electronic component module according to a comparative example 1 including no heat transfer portion.
Figure 11:
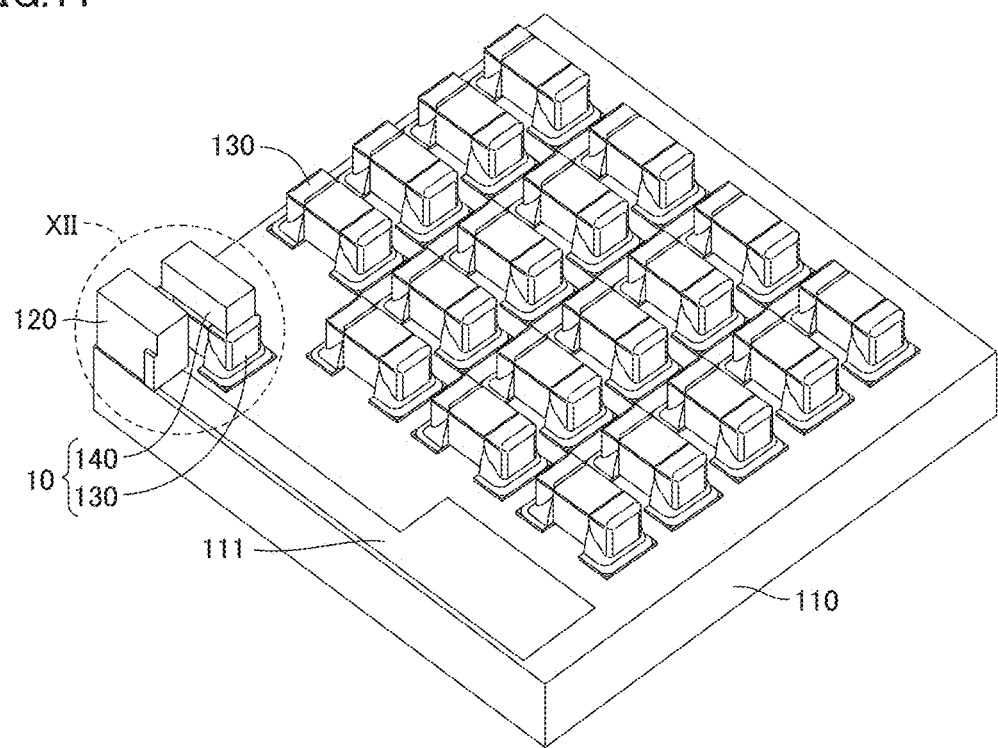
FIG. 11 is a perspective view showing a configuration of an electronic component module in a working example 1 in which one electronic component unit according to preferred embodiment 1 of the present invention is located near the first electronic component.
Figure 12:
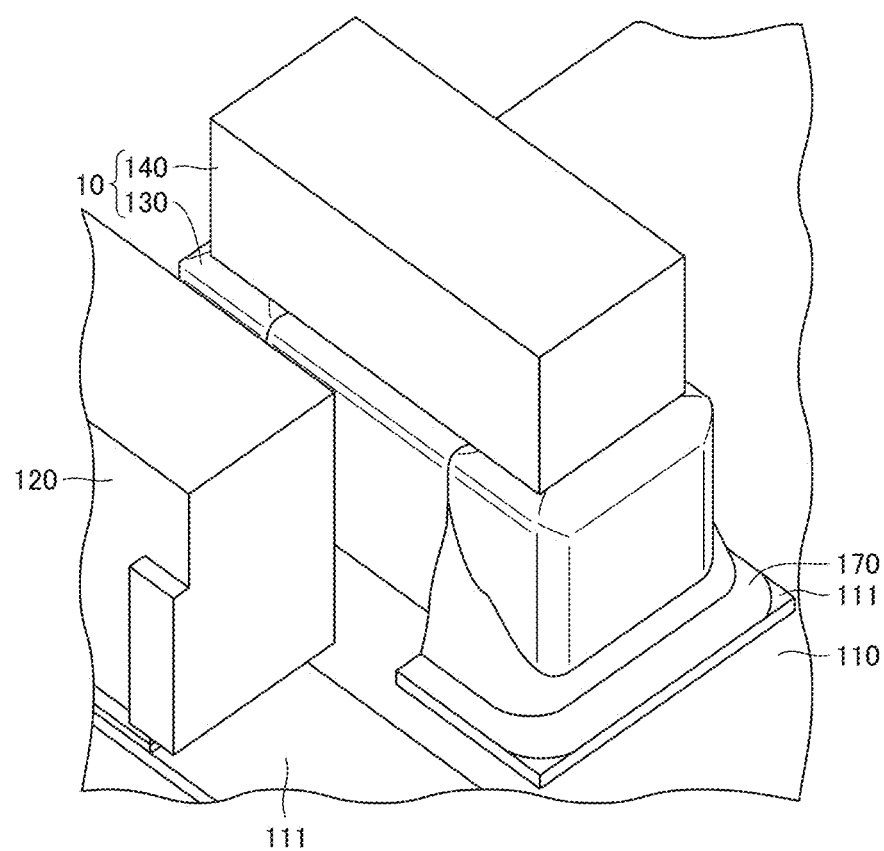
FIG. 12 is an enlarged perspective view of area XII of the electronic component module in FIG. 11.

FIG. 10 is a perspective view showing a configuration of an electronic component module according to a comparative example 1 including no heat transfer portion. FIG. 11 is a perspective view showing a configuration of an electronic component module in a working example 1 in which one electronic component unit according to preferred embodiment 1 is located near the first electronic component. FIG. 12 is an enlarged perspective view of area XII of the electronic component module in FIG. 11.

Figure 13:
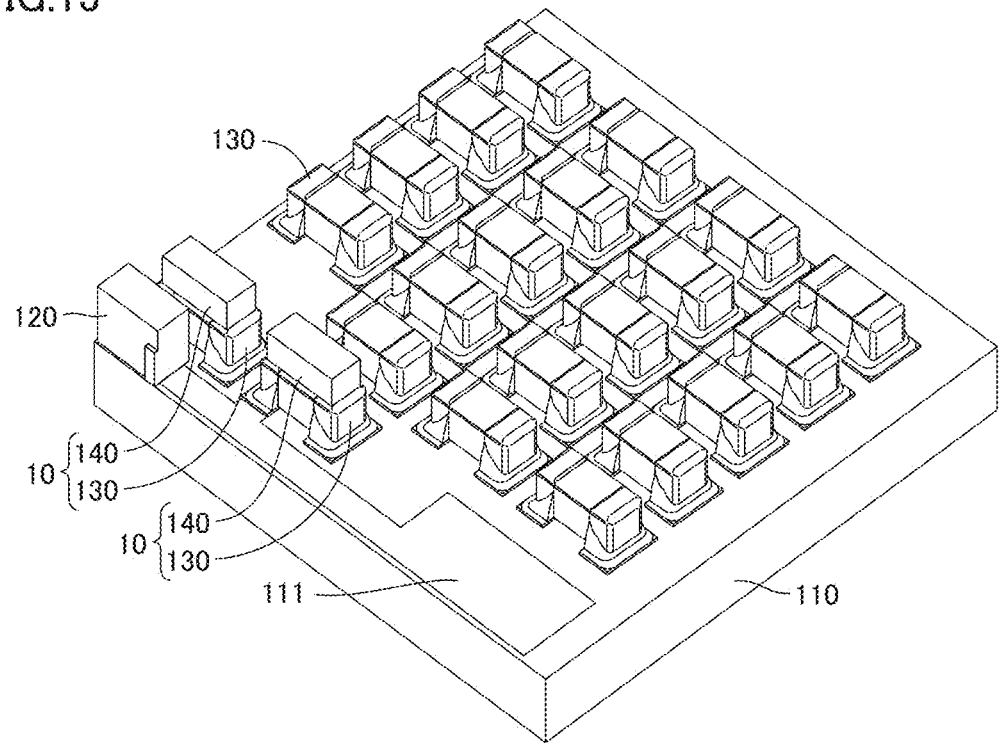
FIG. 13 is a perspective view showing a configuration of an electronic component module according to a working example 2 in which two electronic component units in preferred embodiment 1 of the present invention are aligned in the longer-side direction of heat transfer portion near the first electronic component.
Figure 14:
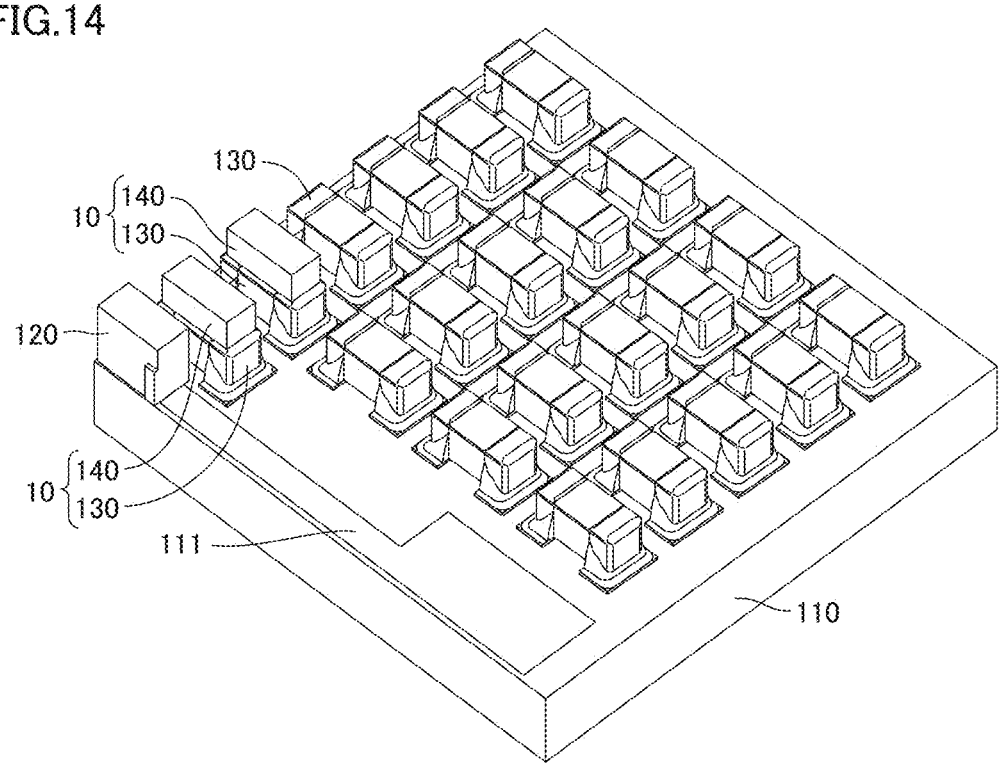
FIG. 14 is a perspective view showing a configuration of an electronic component module according to a working example 3 in which two electronic component units in preferred embodiment 1 of the present invention are aligned in the shorter-side direction of heat transfer portion near the first electronic component.
Figure 15:
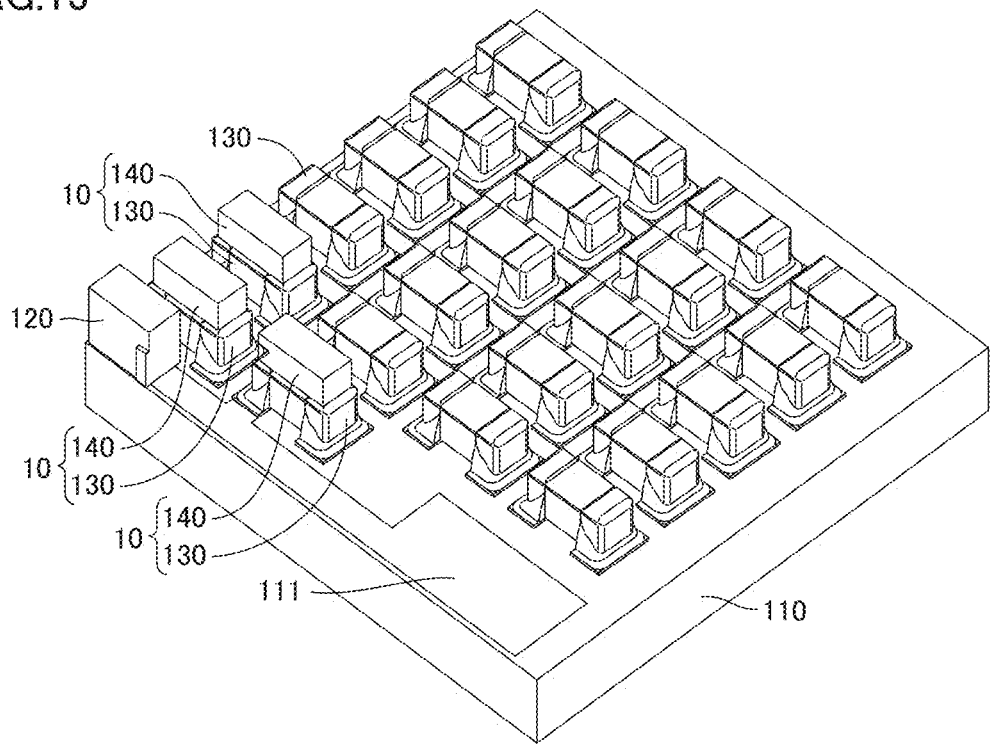
FIG. 15 is a perspective view showing a configuration of an electronic component module in a working example 4 in which three electronic component units according to preferred embodiment 1 of the present invention are located near the first electronic component.

FIG. 13 is a perspective view showing a configuration of an electronic component module in a working example 2 in which two electronic component units in preferred embodiment 1 are aligned in the longer-side direction of heat transfer portion near the first electronic component. FIG. 14 is a perspective view showing a configuration of an electronic component module in a working example 3 in which two electronic component units in preferred embodiment 1 are aligned in the shorter-side direction of heat transfer portion near the first electronic component. FIG. 15 is a perspective view showing a configuration of an electronic component module in a working example 4 in which three electronic component units in preferred embodiment 1 are located near the first electronic component. In FIGS. 10 to 15, resin portion 150 and heat dissipation portion 160 are not shown.

The conditions for the simulation analysis were as follows. Board 110 was a Flame Retardant Type 4 (FR4) having an outside shape of about 12-mm square with a thickness of about 0.8 mm. The wiring pattern including front-side electrodes 111 was made of Cu and had a thickness of about 35 μm.

First electronic component 120 was a positive temperature coefficient (PTC) heater. The PTC heater had a length of about 1.6 mm, a width of about 0.8 mm, and a height of about 0.68 mm. An input of power to the PTC heater was about 0.2 W.

Each second electronic component 130 was a multilayer ceramic capacitor having a length of about 1.0 mm, a width of about 0.5 mm, and a height of about 0.5 mm. The number of second electronic components 130 mounted on board 110 was about 80. One front-side electrode 111 connected to second electronic component 130 located near first electronic component 120 was connected to front-side electrode 111 connected to first electronic component 120. The shortest distance between first electronic component 120 and second electronic component 130 located nearest to first electronic component 120 was set to about 100 μm.

As shown in FIG. 15, in the electronic component module in working example 4, another electronic component unit 10 was aligned with electronic component unit 10 that is located nearest to first electronic component 120, in the longer-side direction of heat transfer portion 140. Also, still another electronic component unit 10 was aligned in the shorter-side direction of heat transfer portion 140.

As shown in FIGS. 11 to 15, each heat transfer portion 140 was a rectangular or substantially rectangular parallelepiped block made of alumina. Resin portion 150 was made of an epoxy resin having a thermal conductivity of about 0.8 W/m·K. As shown in FIGS. 10, 11, and 13 to 15, the simulation analysis was conducted using a symmetrical model of a quarter of each of the above-described electronic component modules.

Also, the simulation analysis was similarly conducted for an electronic component module in a first variation of preferred embodiment 1 including a modified electronic component unit 10, and for electronic component modules in comparative examples 2 and 3 including a columnar pin, instead of electronic component unit 10.

Figure 16:
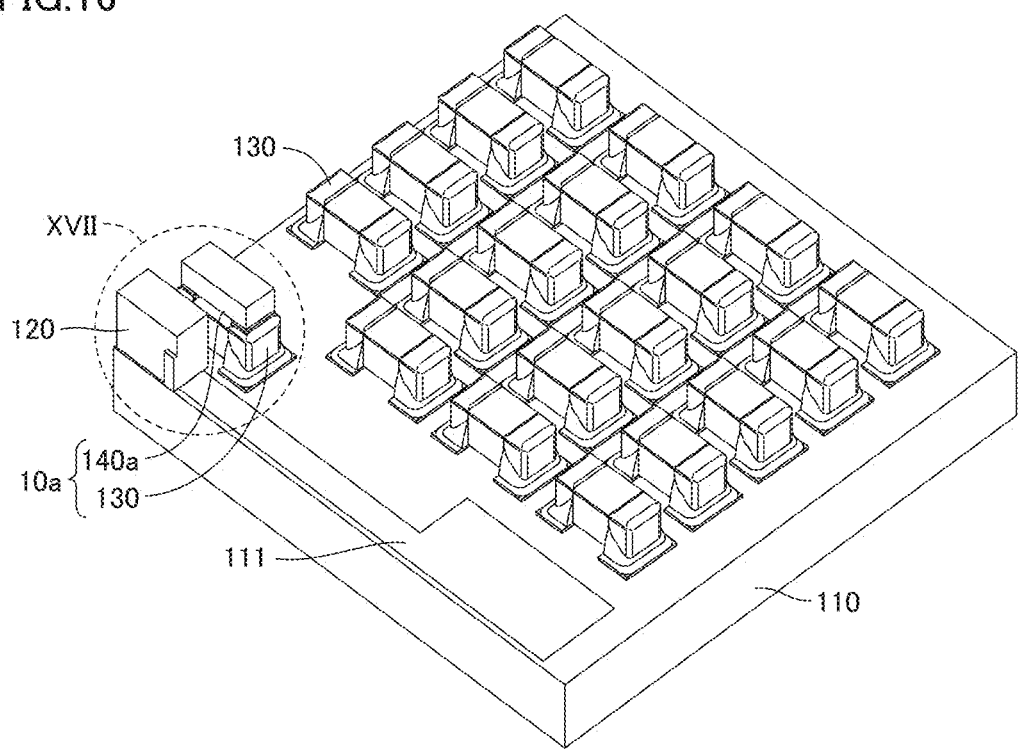
FIG. 16 is a perspective view showing a configuration of an electronic component module according to a working example 5 in which one electronic component unit in a first variation of a preferred embodiment of the present invention is located near the first electronic component.
Figure 17:
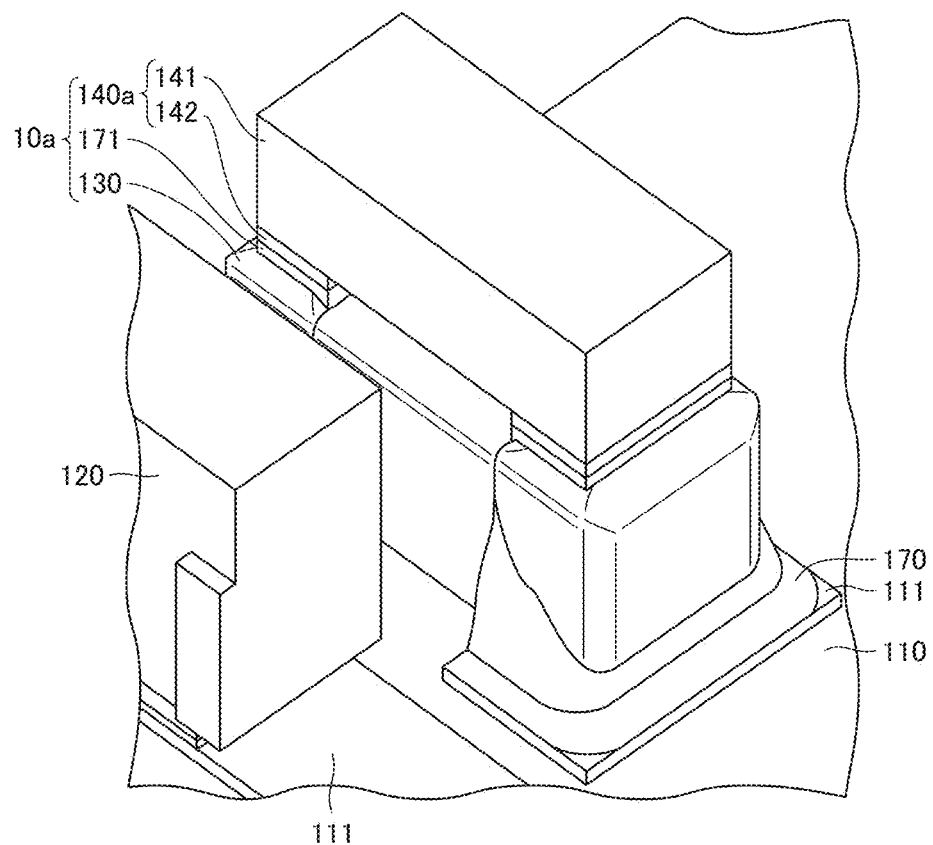
FIG. 17 is an enlarged perspective view of area XVII of the electronic component module in FIG. 16.
Figure 18:
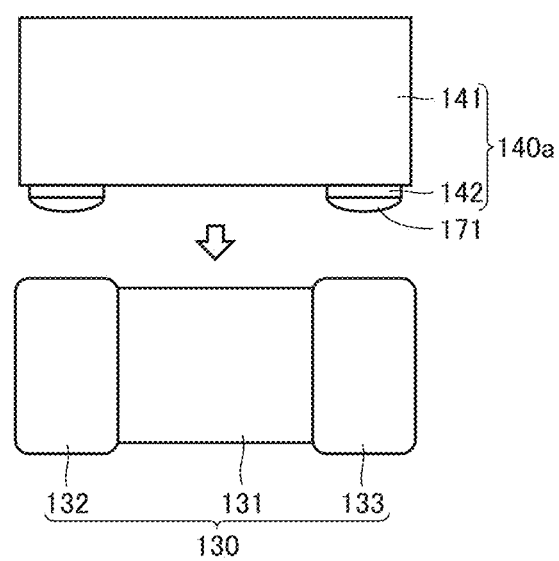
FIG. 18 is a front view showing a heat transfer portion being provided on a second electronic component to produce an electronic component unit in the first variation of a preferred embodiment of the present invention.
Figure 19:
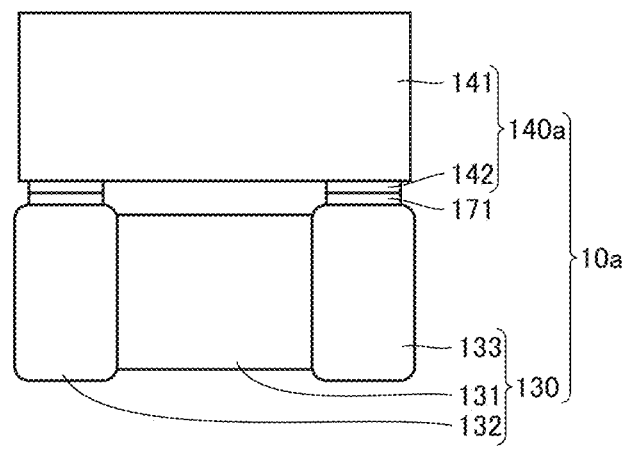
FIG. 19 is a front view showing a configuration of the electronic component unit in the first variation of a preferred embodiment of the present invention.

FIG. 16 is a perspective view showing a configuration of an electronic component module in a working example 5 in which one electronic component unit in the first variation is located near the first electronic component. FIG. 17 is an enlarged perspective view of area XVII of the electronic component module in FIG. 16. FIG. 18 is a front view showing a heat transfer portion being disposed on a second electronic component to produce an electronic component unit in the first variation. FIG. 19 is a front view showing a configuration of the electronic component unit in the first variation. In FIGS. 16 and 17, resin portion 150 and heat dissipation portion 160 are not shown.

As shown in FIGS. 16 to 19, in an electronic component unit 10a in the first variation, a heat transfer portion 140a was connected to both first and second terminal electrodes 132 and 133 via electrically conductive joint portions 171 such that first and second terminal electrodes 132 and 133 of second electronic component 130 were electrically insulated from each other.

Heat transfer portion 140a included a highly thermally conductive member 141 made of an insulating flat plate, and two connection electrodes 142 provided on the surface of highly thermally conductive member 141 on the second electronic component 130 side. One of the two connection electrodes 142 was connected to first terminal electrode 132, and the other of the two connection electrodes 142 was connected to second terminal electrode 133. Highly thermally conductive member 141 was made of alumina. Connection electrodes 142 were made of Cu. Electrically conductive joint portions 171 were made of lead-free solder.

Figure 20:
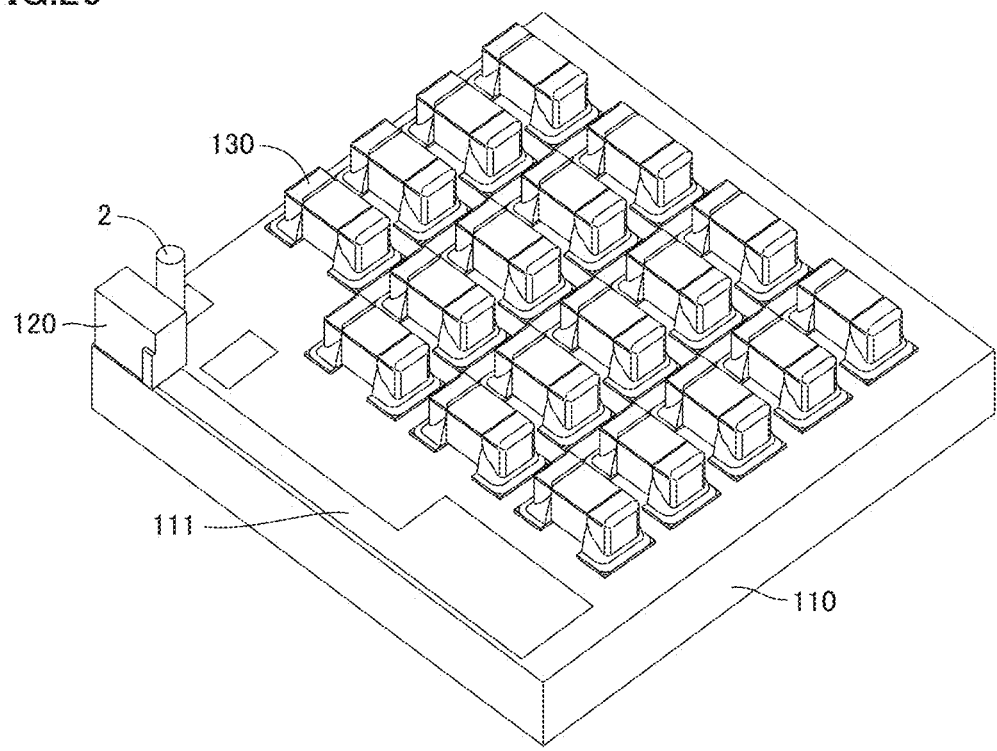
FIG. 20 is a perspective view showing a configuration of an electronic component module according to a comparative example 2 with a pin having a diameter of about 250 μm.
Figure 21:
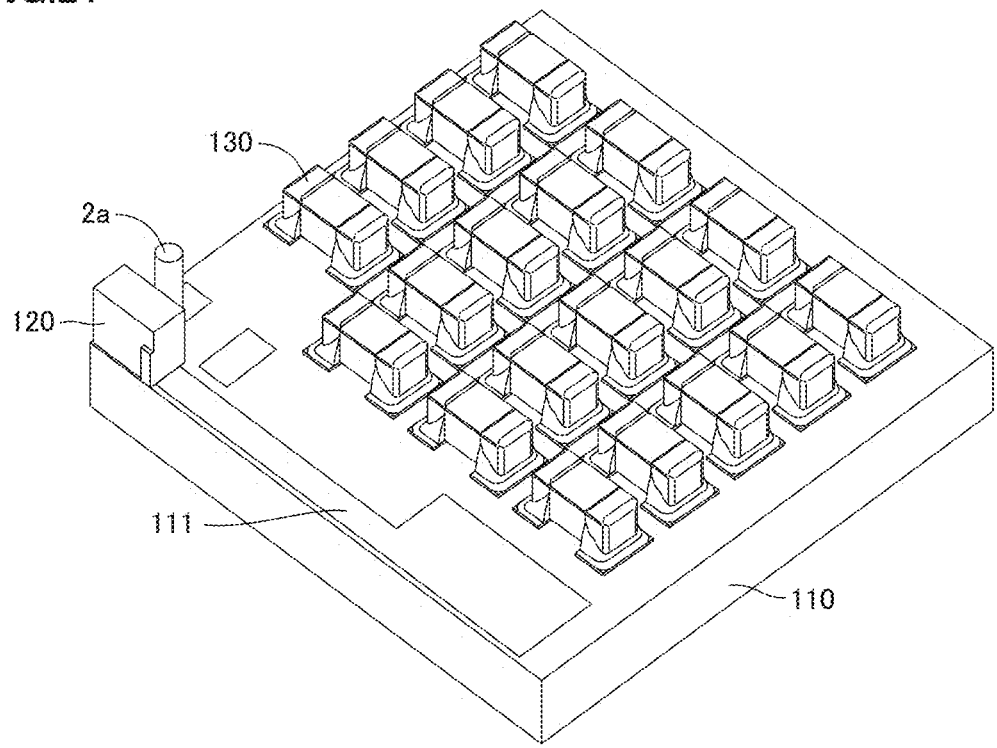
FIG. 21 is a perspective view showing a configuration of an electronic component module according to comparative example 3 with a pin having a diameter of about 300 μm.

FIG. 20 is a perspective view showing a configuration of an electronic component module according to comparative example 2 with a pin having a diameter of about 250 µm. FIG. 21 is a perspective view showing a configuration of an electronic component module in comparative example 3 with a pin having a diameter of about 300 µm. In FIGS. 20 and 21, resin portion 150 and heat dissipation portion 160 are not shown.

As shown in FIG. 20, in an electronic component module according to comparative example 2, a pin 2, made of Cu and having a diameter of about 250 µm, was provided on front-side electrode 111 near first electronic component 120. Front-side electrode 111 connected to pin 2 was connected to front-side electrode 111 connected to first electronic component 120.

As shown in FIG. 21, in an electronic component module according to comparative example 3, a pin 2a, made of Cu and having a diameter of about 300 µm, was provided on front-side electrode 111 near first electronic component 120. Front-side electrode 111 connected to pin 2a was connected to front-side electrode 111 connected to first electronic component 120.

Table 1 shows the results of simulation analysis on the center temperature T1 (° C.) of first electronic component 120 and on the center temperature T2 (° C.) of second electronic component 130 located nearest to first electronic component 120 for the electronic component modules in working examples 1 to 5 and comparative examples 1 to 3 described above.

TABLE 1

| | Center temperature T1 (° C.) of first electronic component | Difference in temperature (° C.) of T1 from comparative example 1 | Center temperature T2 (° C.) of second electronic component | Difference in temperature (° C.) of T2 from comparative example 1 |
|---|---|---|---|---|
| Comparative example 1 | 94.3 | — | 81.7 | — |
| Working example 1 | 91.9 | −2.4 | 78.1 | −3.6 |
| Working example 2 | 91.2 | −3.1 | 78.1 | −3.6 |
| Working example 3 | 90.9 | −3.4 | 77.7 | −4.0 |
| Working example 4 | 90.4 | −3.9 | 77.4 | −4.3 |
| Working example 5 | 92.0 | −2.3 | 78.7 | −3.0 |
| Comparative example 2 | 92.2 | −2.1 | 78.7 | −3.0 |
| Comparative example 3 | 91.9 | −2.4 | 78.5 | −3.2 |

Table 1 shows that electronic component modules in working examples 1 to 5 reduced both center temperature T1 of first electronic component 120 and center temperature T2 of second electronic component 130, as compared to the electronic component module in comparative example 1. Table 1 also shows that the electronic component modules in working examples 1 to 5 reduced both center temperature T1 of first electronic component 120 and center temperature T2 of second electronic component 130 equally to or more than those of the electronic component modules in comparative examples 2 and 3.

The above simulation analysis results show that, in electronic component module 100 according to preferred embodiment 1, electronic component unit 10 located near first electronic component 120 effectively dissipated the heat generated by first electronic component 120. The above simulation analysis results also show that center temperature T2 of second electronic component 130 included in electronic component unit 10 located near first electronic component 120 was also reduced. That is, electronic component module 100 in preferred embodiment 1 can effectively dissipate the heat generated by first electronic component 120, and can also enable second electronic component 130 located near first electronic component 120 to define and function as a heat transfer path.

The simulation analysis results also show that, in the electronic component module in the first variation, electronic component unit 10a located near first electronic component 120 effectively dissipated the heat generated by first electronic component 120. The above simulation analysis results also show that center temperature T2 of second electronic component 130 included in electronic component unit 10a located near first electronic component 120 was also reduced. That is, the electronic component module in the first variation can effectively dissipate the heat generated by first electronic component 120, and can also enable second electronic component 130 located near first electronic component 120 to define and function as a heat transfer path.

Unlike the electronic component modules in comparative examples 2 and 3, the electronic component modules according to preferred embodiment 1 and the first variation do not require mounting of pin 2, 2a as a highly thermally conductive member on board 110, thus enabling downsizing of board 110 and high-density mounting of electronic components.

In electronic component module 100 in preferred embodiment 1 of the present invention, heat transfer portion 140, 140*p* is disposed on the second surface of second electronic component 130 such that heat transfer portion 140, 140*p* is connected to both first and second terminal electrodes 132 and 133. Heat dissipation portion 160 is connected to board 110 via first and second terminal electrodes 132 and 133 and heat transfer portion 140, 140*p*.

Such a configuration can reduce or prevent the deterioration of the electrical characteristics of the heating element itself or other electronic components located near the heating element, even if a large amount of heat is generated by the heating element, or the electronic component module has a reduced thickness, or a heat sink cannot be provided on the top surface of the heating element.

Electronic component module 100 according to preferred embodiment 1 of the present invention further includes resin portion 150 on board 110, with first and second electronic components 120 and 130 being embedded in resin portion 150. Heat transfer portion 140, 140*p* includes a highly thermally conductive member higher in thermal conductivity than resin portion 150. Further, heat dissipation portion 160 is higher in thermal conductivity than resin portion 150. Such a configuration can effectively dissipate the heat generated by the heating element, which would otherwise easily be trapped by resin portion 150. This can reduce or prevent the deterioration of the electrical characteristics of the heating element itself or other electronic components located near the heating element.

In electronic component module 100 in preferred embodiment 1 of the present invention, first and second electronic components 120 and 130 are mounted on one main surface of board 110. This can reduce the thickness of electronic component module 100.

In electronic component module 100 according to preferred embodiment 1 of the present invention, first electronic component 120 is electrically connected to second electronic component 130 via a wiring pattern disposed at at least one of on a surface of and inside board 110. Such a configuration can effectively dissipate the heat generated by first electronic component 120, through second electronic component 130 and heat transfer portion 140 electrically connected to first electronic component 120 via the wiring pattern.

In electronic component module 100 according to preferred embodiment 1 of the present invention, first electronic component 120 is an active component and second electronic component 130 is a passive component. Thus, the heat generated by the active component can be effectively dissipated, thus reducing or preventing the deterioration of the passive component.

In electronic component module 100 according to preferred embodiment 1 of the present invention, second electronic component 130 is preferably, for example, a multilayer ceramic capacitor. Thus, the multilayer ceramic capacitor mounted on board 110 can be used as a heat transfer path.

In electronic component module 100 in preferred embodiment 1 of the present invention, heat transfer portion 140 is in contact with first terminal electrode 132, second terminal electrode 133, and a portion of body 131 that is located between first and second terminal electrodes 132 and 133, on the side of second electronic component 130 opposite from board 110. Such a configuration allows heat to transfer to heat transfer portion 140 through first and second terminal electrodes 132 and 133, and also through body 131. This enables an increased amount of heat transfer to heat dissipation portion 160, thus effectively dissipating the heat through heat dissipation portion 160.

In electronic component module 100 according to preferred embodiment 1 of the present invention, heat dissipation portion 160 is made of an electrically conductive film. This can reduce the thickness of electronic component module 100.

Electronic component module 100 according to preferred embodiment 1 of the present invention includes a plurality of second electronic components 130. Two or more of the plurality of second electronic components 130 are connected to one heat transfer portion 140*p* at their first and second terminal electrodes 132 and 133. This enables easy handling when small-sized second electronic components 130 are mounted on board 110.

In electronic component unit 10 according to preferred embodiment 1 of the present invention, heat transfer portion 140 includes a highly thermally conductive member higher in thermal conductivity than resin portion 150. Further, heat transfer portion 140 is connected to both first and second terminal electrodes 132 and 133 such that first and second terminal electrodes 132 and 133 are maintained independent of each other in terms of potential. Such a configuration enables heat to transfer through first and second terminal electrodes 132 and 133 to heat transfer portion 140 while preventing short circuits between first and second terminal electrodes 132 and 133.

A non-limiting example of a method for manufacturing an electronic component module according to preferred embodiment 1 of the present invention includes producing resin portion 150 lower in thermal conductivity than heat transfer portion 140, so that first electronic component 120 mounted on board 110 is embedded in resin portion 150; and producing heat dissipation portion 160 higher in thermal conductivity than resin portion 150, so that heat dissipation portion 160 is connected to board 110 via first and second terminal electrodes 132 and 133 and heat transfer portion 140. Such a configuration can reduce or prevent the heat generated by first electronic component 120 from being trapped in resin portion 150 and effectively dissipate the heat through first and second terminal electrodes 132 and 133, heat transfer portion 140, and heat dissipation portion 160.

In a non-limiting example of a method for manufacturing an electronic component module according to preferred embodiment 1 of the present invention, the producing of resin portion 150 includes providing resin portion 150 greater in height than heat transfer portion 140, and then grinding resin portion 150 and also grinding a portion of heat transfer portion 140, so that heat transfer portion 140 is exposed at a surface of resin portion 150. This can ensure that heat transfer portion 140 is exposed through resin portion 150 to be directly in contact with heat dissipation portion 160. Thus, the heat transferred through heat transfer portion 140 can be effectively transferred to heat dissipation portion 160 to be dissipated.

In electronic component unit 10*a* in the first variation, heat transfer portion 140*a* is defined by an insulating flat plate. Thus, the surface of heat transfer portion 140*a* on the opposite side from second electronic component 130 is a flat surface. Accordingly, electronic component unit 10*a* can be stably sucked and held by pickup nozzle 1 of a pick-and-place machine.

Other variations of the electronic component module and the electronic component unit according to preferred embodiments of the present invention will now be described.

Figure 22:
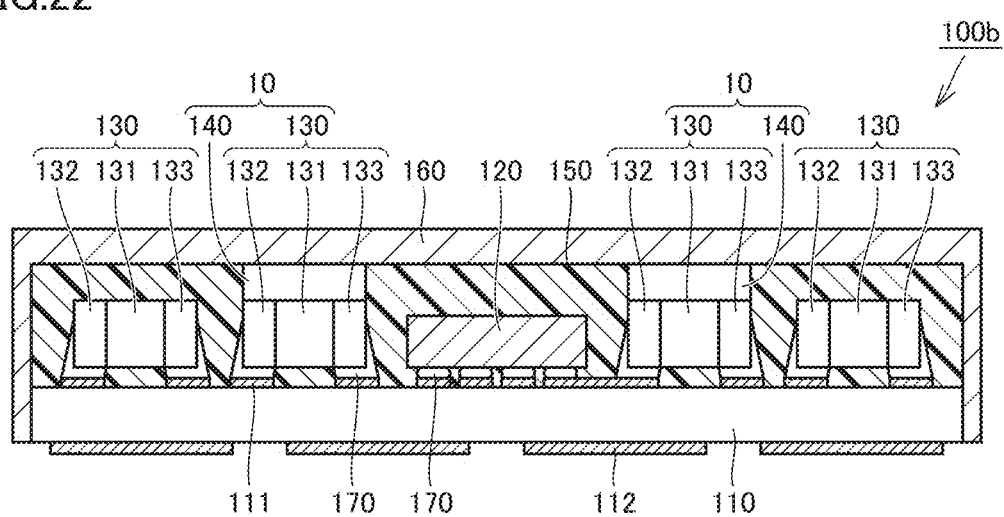
FIG. 22 is a cross-sectional view showing a configuration of an electronic component module according to a second variation of a preferred embodiment of the present invention.

FIG. 22 is a cross-sectional view showing a configuration of an electronic component module in a second variation. FIG. 22 shows a cross section taken at the same position as FIG. 2. As shown in FIG. 22, in an electronic component module 100b in the second variation, heat transfer portion 140 is provided on only second electronic component 130 adjacent to first electronic component 120. While FIG. 22 shows two heat transfer portions 140, the number of heat transfer portions 140 may be only one.

By providing heat transfer portion 140 on only second electronic component 130 adjacent to first electronic component 120, the cost of electronic component module 100b can be reduced without significantly compromising the heat dissipation effect.

The location of the electronic component unit is not limited to the region adjacent to first electronic component 120. For example, electronic component unit 10 may be located between first electronic component 120 and a heat-sensitive electronic component, thus reducing the heat transfer to the heat-sensitive electronic component and effectively protecting the heat-sensitive electronic component.

Figure 23:
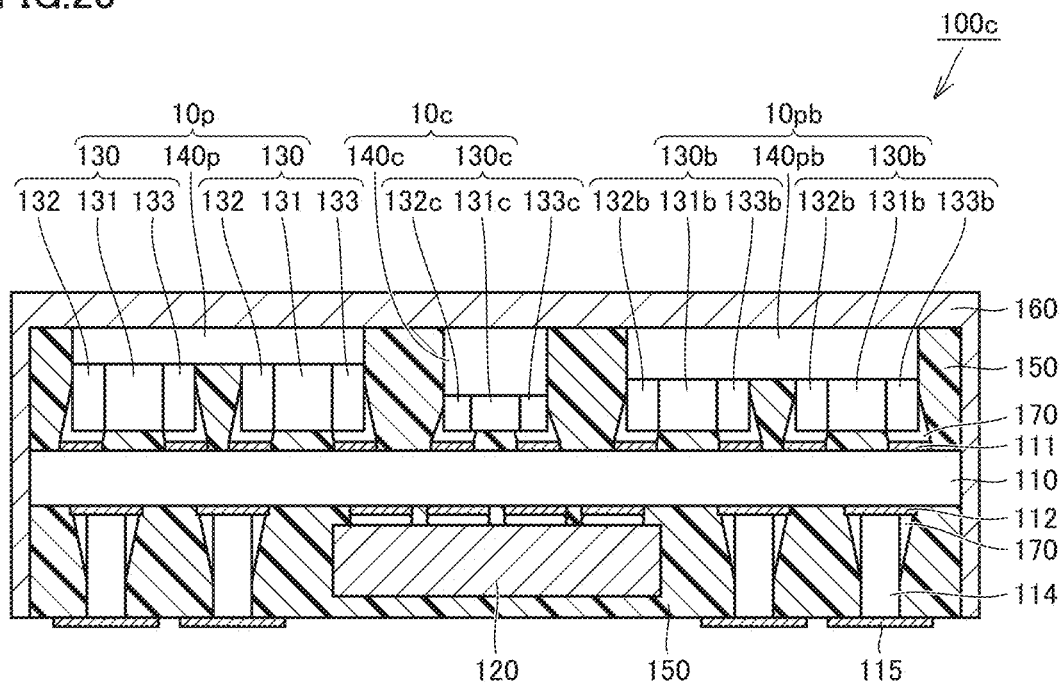
FIG. 23 is a cross-sectional view showing a configuration of an electronic component module according to a third variation of a preferred embodiment of the present invention.

FIG. 23 is a cross-sectional view showing a configuration of an electronic component module in a third variation. FIG. 23 shows a cross section taken at the same position as FIG. 2. As shown in FIG. 23, an electronic component module 100c in the third variation includes second electronic components 130, 130b, 130c mounted on one main surface of board 110. First electronic component 120 is mounted on the other main surface of board 110. Second electronic component 130c is similar in configuration to second electronic component 130b except that second electronic component 130c has a smaller chip size than second electronic component 130b.

On one main surface of board 110, electronic component units 10c, 10p, 10pb are mounted. Electronic component unit 10c includes a second electronic component 130c and a heat transfer portion 140c. Second electronic component 130c includes a body 131c, a first terminal electrode 132c, and a second terminal electrode 133c. In electronic component unit 10c, heat transfer portion 140c is connected to both first and second terminal electrodes 132c and 133c such that first and second terminal electrodes 132c and 133c of second electronic component 130c are electrically insulated from each other.

Electronic component unit 10pb includes two second electronic components 130b and one heat transfer portion 140pb. In electronic component unit 10pb, two second electronic components 130b are connected to one heat transfer portion 140pb at their first and second terminal electrodes 132b and 133b.

On the other main surface of board 110, first electronic component 120 and a plurality of pins 114 are mounted. The plurality of pins 114 are connected to back-side electrodes 112 via electrically conductive joint portions 170. On the end surfaces of the plurality of pins 114 on the opposite side from board 110, terminals 115 are exposed through resin portion 150. Pins 114 and terminals 115 are preferably made of metal, such as Ag or Cu, for example.

Resin portion 150 is provided on each of one main surface and the other main surface of board 110. First electronic component 120 and second electronic components 130, 130b, 130c are embedded in resin portions 150.

Heat transfer portions 140c, 140p, 140pb are ground along with resin portion 150, so that the total thickness of heat transfer portion 140c and second electronic component 130c, the total thickness of heat transfer portion 140p and second electronic component 130, and the total thickness of heat transfer portion 140pb and second electronic component 130b are all equal or substantially equal. This enables heat transfer portions 140c, 140p, 140pb to have thicknesses corresponding to the thicknesses of second electronic components 130c, 130, 130b.

Heat dissipation portion 160 is connected to board 110 via first and second terminal electrodes 132c and 133c and heat transfer portion 140c. Also, heat dissipation portion 160 is connected to board 110 via first and second terminal electrodes 132 and 133 and heat transfer portion 140p. Further, heat dissipation portion 160 is connected to board 110 via first and second terminal electrodes 132b and 133b and heat transfer portion 140pb.

Heat dissipation portion 160 covers resin portion 150 and heat transfer portions 140c, 140p, 140pb. In the present preferred embodiment, heat dissipation portion 160 is directly in contact with heat transfer portions 140c, 140p, 140pb.

It is preferred that, as seen in the direction orthogonal or substantially orthogonal to board 110, any of electronic component units 10c, 10p, 10pb overlaps with first electronic component 120. Such a configuration enables the heat generated by first electronic component 120 to transfer through board 110 mainly to any of electronic component units 10c, 10p, 10pb that overlaps with first electronic component 120. The heat that has transferred to any of electronic component units 10c, 10p, 10pb is transferred to heat dissipation portion 160 to be dissipated therethrough. Thus, the heat generated by first electronic component 120 can be effectively dissipated.

In electronic component module 100c in the third variation, the electronic components are mounted on both sides of board 110, thus enabling downsizing of board 110 and high-density mounting of electronic components.

Figure 24:
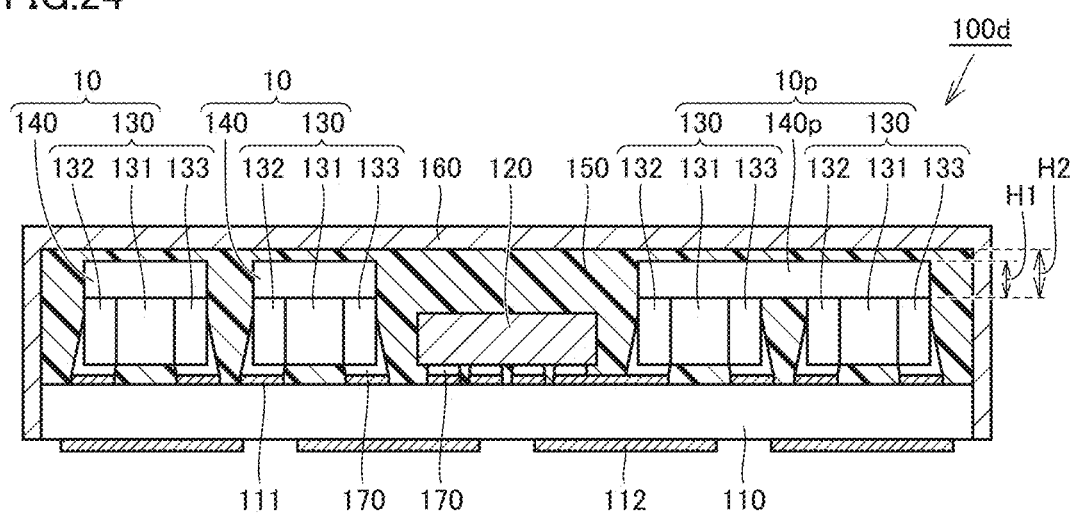
FIG. 24 is a cross-sectional view showing a configuration of an electronic component module according to a fourth variation of a preferred embodiment of the present invention.

FIG. 24 is a cross-sectional view showing a configuration of an electronic component module in a fourth variation. FIG. 24 shows a cross section taken at the same position as FIG. 2. As shown in FIG. 24, in an electronic component module 100d in the fourth variation, heat transfer portions 140, 140p are indirectly in contact with heat dissipation portion 160. That is, heat transfer portion 140 of electronic component unit 10 and heat transfer portion 140p of electronic component unit 10p are not exposed through resin portion 150.

The relationship of $H_1 > H_2/2$ is satisfied, where $H_1$ denotes the thickness of heat transfer portions 140, 140p and $H_2$ denotes the thickness of resin portion 150 located above second electronic components 130. This can prevent an excessive increase in thermal resistance of resin portion 150 located between heat transfer portions 140, 140p and heat dissipation portion 160, thus ensuring the heat dissipation effect produced by heat transfer portions 140, 140p.

Electronic component module 100d in the fourth variation, in which heat transfer portions 140, 140p are not exposed through resin portion 150, can improve the resistance to moisture of electronic component units 10, 10p.

Figure 25:
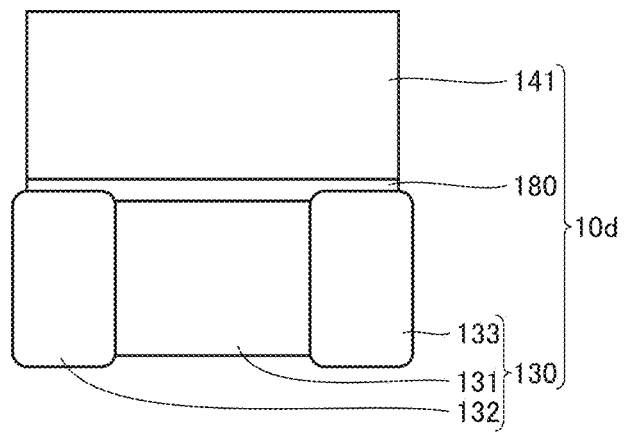
FIG. 25 is a front view showing a configuration of an electronic component unit according to a fifth variation of a preferred embodiment of the present invention.

FIG. 25 is a front view showing a configuration of an electronic component unit in a fifth variation. As shown in FIG. 25, in an electronic component unit 10d in the fifth variation, highly thermally conductive member 141 (i.e., a heat transfer portion) is connected to both first and second terminal electrodes 132 and 133 via an adhesion layer 180 such that first and second terminal electrodes 132 and 133 of second electronic component 130 are electrically insulated from each other.

As described in the first variation, highly thermally conductive member 141 is defined by an insulating flat plate.

Highly thermally conductive member 141 is preferably made of, for example, an oxide, such as $SiO_2$, $BaTiO_3$, of $Al_2O_3$; or a nitride, such as AlN. Highly thermally conductive member 141 may be made of filler-containing silicone resin hardened into a block.

Adhesion layer 180 is made of any of known adhesives. Adhesion layer 180 is in contact with first terminal electrode 132, second terminal electrode 133, and the portion of body 131 that is located between first and second terminal electrodes 132 and 133, on the side of second electronic component 130 opposite from board 110.

In electronic component unit 10d in the fifth variation, highly thermally conductive member 141 (i.e., a heat transfer portion) is defined by an insulating flat plate. Thus, the surface of highly thermally conductive member 141 on the opposite side from second electronic component 130 is a flat surface. Accordingly, electronic component unit 10d can be stably sucked and held by pickup nozzle 1 of a pick-and-place machine.

Figure 26:
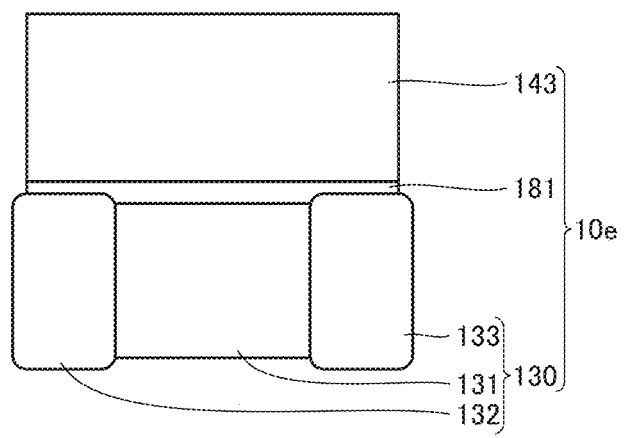
FIG. 26 is a front view showing a configuration of an electronic component unit according to a sixth variation of a preferred embodiment of the present invention.

FIG. 26 is a front view showing a configuration of an electronic component unit in a sixth variation. As shown in FIG. 26, in an electronic component unit 10e in the sixth variation, a highly thermally conductive member 143 (i.e., a heat transfer portion) is connected to both first and second terminal electrodes 132 and 133 via an insulating adhesion layer 181 such that first and second terminal electrodes 132 and 133 of second electronic component 130 are electrically insulated from each other.

Highly thermally conductive member 143 is defined by a metallic flat plate. Highly thermally conductive member 143 is preferably made of a highly electrically conductive metal, such as Cu or Al, for example.

Insulating adhesion layer 181 is made of any of known insulating adhesives, such as an epoxy resin adhesive, for example. Insulating adhesion layer 181 is in contact with first terminal electrode 132, second terminal electrode 133, and a portion of body 131 that is located between first and second terminal electrodes 132 and 133, on the side of second electronic component 130 opposite from board 110.

In electronic component unit 10e in the sixth variation, highly thermally conductive member 143 (i.e., a heat transfer portion) is defined by a metallic flat plate. Thus, the surface of highly thermally conductive member 143 on the opposite side from second electronic component 130 is a flat surface. Accordingly, electronic component unit 10e can be stably sucked and held by pickup nozzle 1 of a pick-and-place machine.

Highly thermally conductive member 143, which is preferably made of a metallic member, has a high thermal conductivity. Thus, the heat generated by a heating element can be effectively transferred through electronic component unit 10e to the heat dissipation portion to be dissipated therethrough.

Further, insulating adhesion layer 181, via which highly thermally conductive member 143 is connected to first and second terminal electrodes 132 and 133, enables the heat to transfer through first and second terminal electrodes 132 and 133 to highly thermally conductive member 143, while preventing short circuits between first and second terminal electrodes 132 and 133.

Figure 27:
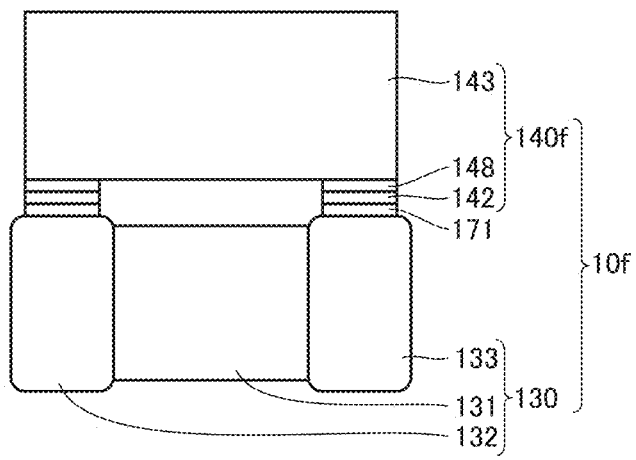
FIG. 27 is a front view showing a configuration of an electronic component unit according to a seventh variation of a preferred embodiment of the present invention.

FIG. 27 is a front view showing a configuration of an electronic component unit in a seventh variation. As shown in FIG. 27, in an electronic component unit 10f in the seventh variation, a heat transfer portion 140f is connected to both first and second terminal electrodes 132 and 133 via electrically conductive joint portions 171 such that first and second terminal electrodes 132 and 133 of second electronic component 130 are electrically insulated from each other.

Heat transfer portion 140f includes highly thermally conductive member 143 defined by a metallic flat plate, two ceramic underlying layers 148 provided on the surface of highly thermally conductive member 143 on the second electronic component 130 side, and connection electrodes 142 provided on ceramic underlying layers 148. Ceramic underlying layers 148 are made of electrically insulating ceramic.

One of the two connection electrodes 142 is connected to first terminal electrode 132, and the other of the two connection electrodes 142 is connected to second terminal electrode 133.

In electronic component unit 10f in the seventh variation, highly thermally conductive member 143 (i.e., a heat transfer portion) is defined by a metallic flat plate. Thus, the surface of highly thermally conductive member 143 on the opposite side from second electronic component 130 is a flat surface. Accordingly, electronic component unit 10f can be stably sucked and held by pickup nozzle 1 of a pick-and-place machine.

Highly thermally conductive member 143, which is defined by a metallic member, has a high thermal conductivity. Thus, the heat generated by a heating element can be effectively transferred through electronic component unit 10f to the heat dissipation portion to be dissipated therethrough.

Further, ceramic underlying layers 148, via which highly thermally conductive member 143 is connected to first and second terminal electrodes 132 and 133, enables the heat to transfer through first and second terminal electrodes 132 and 133 to highly thermally conductive member 143, while preventing short circuits between first and second terminal electrodes 132 and 133.

Figure 28:
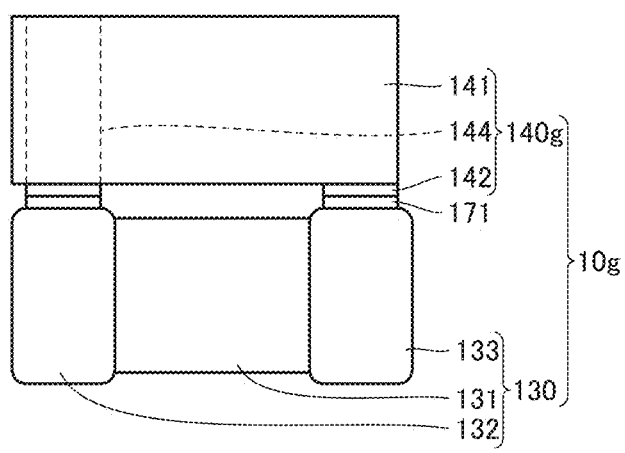
FIG. 28 is a front view showing a configuration of an electronic component unit according to an eighth variation of a preferred embodiment of the present invention.

FIG. 28 is a front view showing a configuration of an electronic component unit in an eighth variation. As shown in FIG. 28, in an electronic component unit 10g in the eighth variation, a heat transfer portion 140g is connected to both first and second terminal electrodes 132 and 133 via electrically conductive joint portions 171 such that first and second terminal electrodes 132 and 133 of second electronic component 130 are electrically insulated from each other.

Heat transfer portion 140g includes highly thermally conductive member 141 defined by an insulating flat plate, one auxiliary heat conductor 144 disposed inside highly thermally conductive member 141, and two connection electrodes 142 provided on the surface of highly thermally conductive member 141 on the second electronic component 130 side.

Auxiliary heat conductor 144 is preferably made of a highly electrically conductive metal, such as Cu or Al, for example. Auxiliary heat conductor 144 extends in the thickness direction of highly thermally conductive member 141.

In electronic component unit 10g in the eighth variation, auxiliary heat conductor 144 includes one end connected to one of the two connection electrodes 142, and the other end exposed at the surface of highly thermally conductive member 141 on the opposite side from second electronic component 130.

Providing auxiliary heat conductor 144 can improve the thermal conductivity of heat transfer portion 140g. Further, auxiliary heat conductor 144 being connected to only one of the two connection electrodes 142 can prevent short circuits between first and second terminal electrodes 132 and 133.

Figure 29:
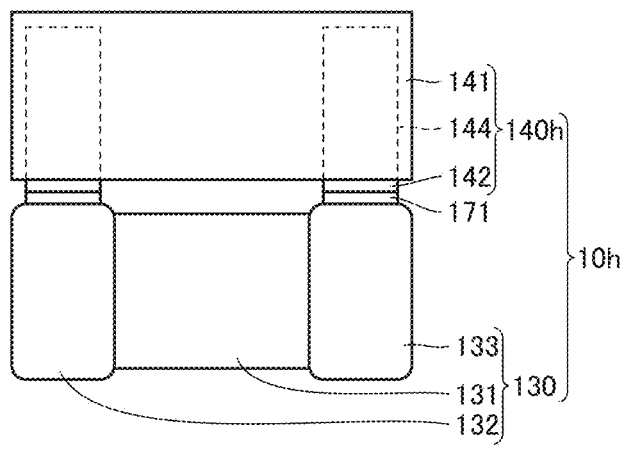
FIG. 29 is a front view showing a configuration of an electronic component unit according to a ninth variation of a preferred embodiment of the present invention.

FIG. 29 is a front view showing a configuration of an electronic component unit in a ninth variation. As shown in FIG. 29, in an electronic component unit 10h in the ninth variation, a heat transfer portion 140h is connected to both first and second terminal electrodes 132 and 133 via electrically conductive joint portions 171 such that first and second terminal electrodes 132 and 133 of second electronic component 130 are electrically insulated from each other.

Heat transfer portion 140h includes highly thermally conductive member 141 defined by an insulating flat plate, two auxiliary heat conductors 144 disposed inside highly thermally conductive member 141, and two connection electrodes 142 formed on the face of highly thermally conductive member 141 on the second electronic component 130 side.

In electronic component unit 10h in the ninth variation, one of the two auxiliary heat conductors 144 includes one end connected to one of the two connection electrodes 142, and the other end not exposed at the surface of highly thermally conductive member 141 on the opposite side from second electronic component 130.

The other of the two auxiliary heat conductors 144 includes one end connected to the other of the two connection electrodes 142, and the other end not exposed at the surface of highly thermally conductive member 141 on the opposite side from second electronic component 130.

Providing two auxiliary heat conductors 144 can improve the thermal conductivity of heat transfer portion 140h. Further, since the other end of each of the two auxiliary heat conductors 144 is not exposed at the surface of highly thermally conductive member 141 on the opposite side from second electronic component 130, short circuits between first and second terminal electrodes 132 and 133 can be prevented.

Figure 30:
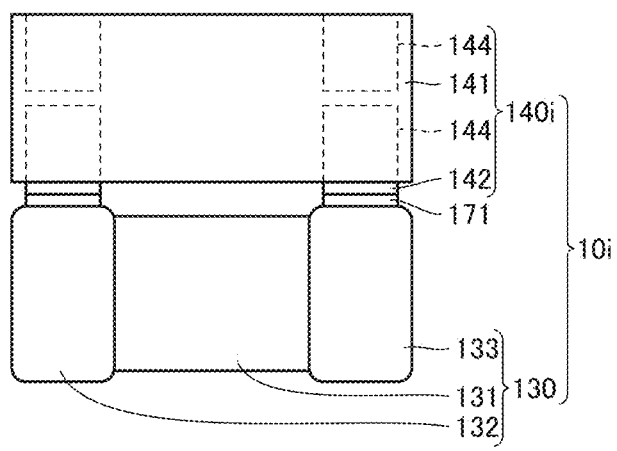
FIG. 30 is a front view showing a configuration of an electronic component unit according to a tenth variation of a preferred embodiment of the present invention.

FIG. 30 is a front view showing a configuration of an electronic component unit in a tenth variation. As shown in FIG. 30, in an electronic component unit 10i in the tenth variation, a heat transfer portion 140i is connected to both first and second terminal electrodes 132 and 133 via electrically conductive joint portions 171 such that first and second terminal electrodes 132 and 133 of second electronic component 130 are electrically insulated from each other.

Heat transfer portion 140i includes highly thermally conductive member 141 defined by an insulating flat plate, four auxiliary heat conductors 144 disposed inside highly thermally conductive member 141, and two connection electrodes 142 provided on the surface of highly thermally conductive member 141 on the second electronic component 130 side.

In electronic component unit 10i in the tenth variation, a first auxiliary heat conductor 144 of the four auxiliary heat conductors 144 includes one end connected to one of the two connection electrodes 142, and the other end not exposed at the surface of highly thermally conductive member 141 on the opposite side from second electronic component 130.

A second auxiliary heat conductor 144 of the four auxiliary heat conductors 144 includes one end connected to the other of the two connection electrodes 142, and the other end not exposed at the surface of highly thermally conductive member 141 on the opposite side from second electronic component 130.

A third auxiliary heat conductor 144 of the four auxiliary heat conductors 144 includes one end facing the other end of first auxiliary heat conductor 144 with a gap therebetween, and the other end exposed at the surface of highly thermally conductive member 141 on the opposite side from second electronic component 130.

A four auxiliary heat conductor 144 of the four auxiliary heat conductors 144 includes one end facing the other end of second auxiliary heat conductor 144 with a gap therebetween, and the other end exposed at the surface of highly thermally conductive member 141 on the opposite side from second electronic component 130.

Providing four auxiliary heat conductors 144 can improve the thermal conductivity of heat transfer portion 140i. Further, since one end of third auxiliary heat conductor 144 faces the other end of first auxiliary heat conductor 144 with a gap therebetween, and one end of fourth auxiliary heat conductor 144 faces the other end of second auxiliary heat conductor 144 with a gap therebetween, short circuits between first and second terminal electrodes 132 and 133 can be prevented.

Figure 31:
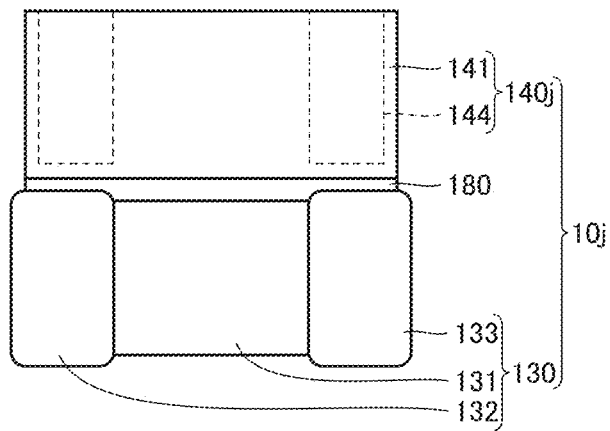
FIG. 31 is a front view showing a configuration of an electronic component unit according to an eleventh variation of a preferred embodiment of the present invention.

FIG. 31 is a front view showing a configuration of an electronic component unit in an eleventh variation. As shown in FIG. 31, in an electronic component unit 10j in the eleventh variation, a heat transfer portion 140j is connected to both first and second terminal electrodes 132 and 133 via adhesion layer 180 such that first and second terminal electrodes 132 and 133 of second electronic component 130 are electrically insulated from each other.

Heat transfer portion 140j includes highly thermally conductive member 141 defined by an insulating flat plate, and two auxiliary heat conductors 144 disposed inside highly thermally conductive member 141.

In electronic component unit 10j in the eleventh variation, one of the two auxiliary heat conductors 144 includes one end not exposed at the surface of highly thermally conductive member 141 on the second electronic component 130 side, and the other end exposed at the surface of highly thermally conductive member 141 on the opposite side from second electronic component 130.

The other of the two auxiliary heat conductors 144 includes one end not exposed at the surface of highly thermally conductive member 141 on the second electronic component 130 side, and the other end exposed at the surface of highly thermally conductive member 141 on the opposite side from second electronic component 130.

Providing two auxiliary heat conductors 144 can improve the thermal conductivity of heat transfer portion 140j. Further, since one end of each of the two auxiliary heat conductors 144 is not exposed at the surface of highly thermally conductive member 141 on the second electronic component 130 side, short circuits between first and second terminal electrodes 132 and 133 can be prevented.

Figure 32:
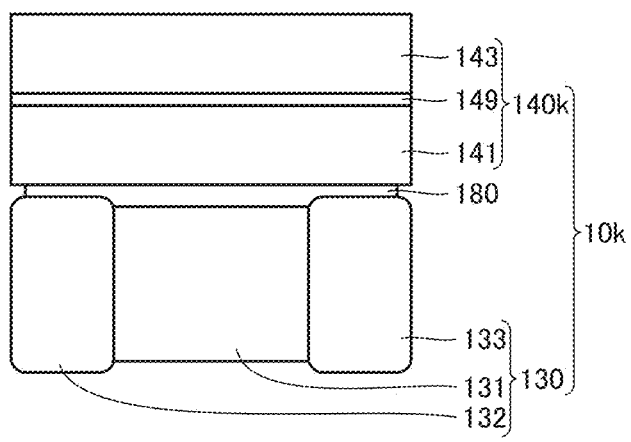
FIG. 32 is a front view showing a configuration of an electronic component unit according to a twelfth variation of a preferred embodiment of the present invention.

FIG. 32 is a front view showing a configuration of an electronic component unit in a twelfth variation. As shown in FIG. 32, in an electronic component unit 10k in the twelfth variation, a heat transfer portion 140k is connected to both first and second terminal electrodes 132 and 133 via adhesion layer 180 such that first and second terminal electrodes 132 and 133 of second electronic component 130 are electrically insulated from each other.

Heat transfer portion 140k includes highly thermally conductive member 141 defined by an insulating flat plate, highly thermally conductive member 143 defined by a metallic flat plate, and an adhesion layer 149 connecting highly thermally conductive member 141 and highly thermally conductive member 143.

In electronic component unit 10k in the twelfth variation, highly thermally conductive member 141 is connected to both first and second terminal electrodes 132 and 133 via adhesion layer 180, and highly thermally conductive member 143 is connected to highly thermally conductive member 141 via adhesion layer 149.

Highly thermally conductive member 143 is made of a material that is easier to grind than highly thermally conductive member 141. This makes the production of electronic component unit 10k easier.

Providing highly thermally conductive member 143 can improve the thermal conductivity of heat transfer portion 140k. Further, adhesion layer 180, via which highly thermally conductive member 141 is connected to first and second terminal electrodes 132 and 133, can prevent short circuits between first and second terminal electrodes 132 and 133.

Figure 33:
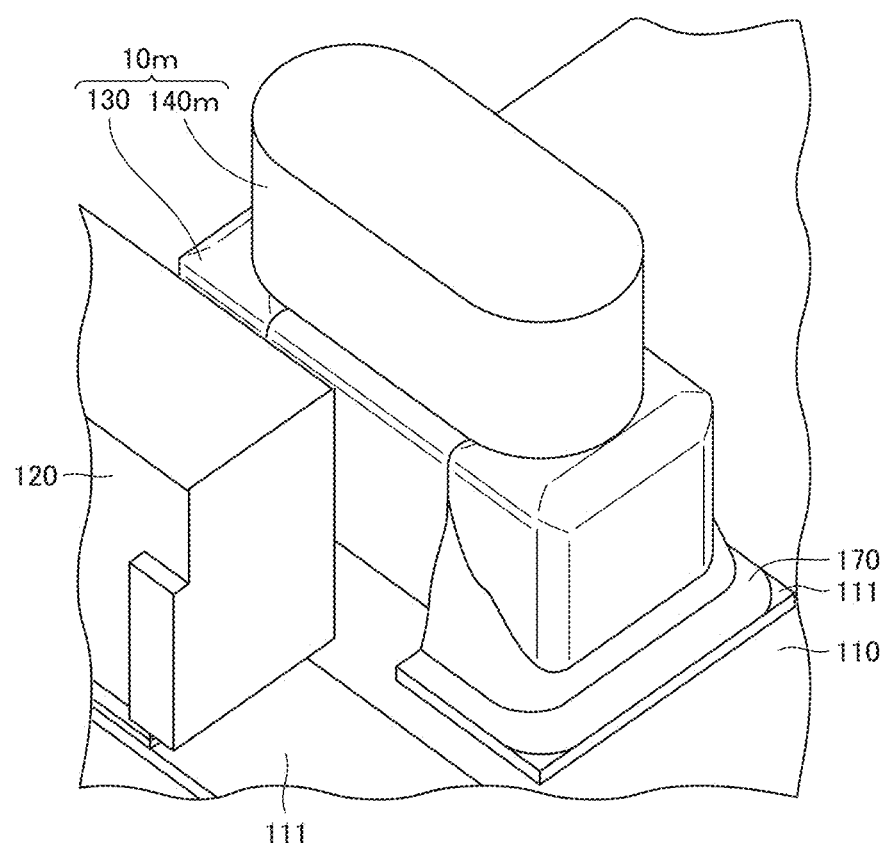
FIG. 33 is a perspective view showing a configuration of an electronic component unit according to a thirteenth variation of a preferred embodiment of the present invention.

FIG. 33 is a perspective view showing a configuration of an electronic component unit in a thirteenth variation. FIG. 33 is a view shown in the same direction as FIG. 12.

As shown in FIG. 33, in an electronic component unit 10m in the thirteenth variation, a heat transfer portion 140m is connected to both first and second terminal electrodes 132 and 133 such that first and second terminal electrodes 132 and 133 of second electronic component 130 are electrically insulated from each other.

Heat transfer portion 140m is different from heat transfer portion 140 in preferred embodiment 1 only in shape. Heat transfer portion 140m preferably has an elliptical or substantially elliptical cylindrical shape, for example.

In electronic component unit 10m in the thirteenth variation, heat transfer portion 140m, having an elliptical or substantially elliptical cylindrical shape, enables good fluidity of resin when resin portion 150 is formed. This can reduce or prevent the formation of voids in resin portion 150.

Figure 34:
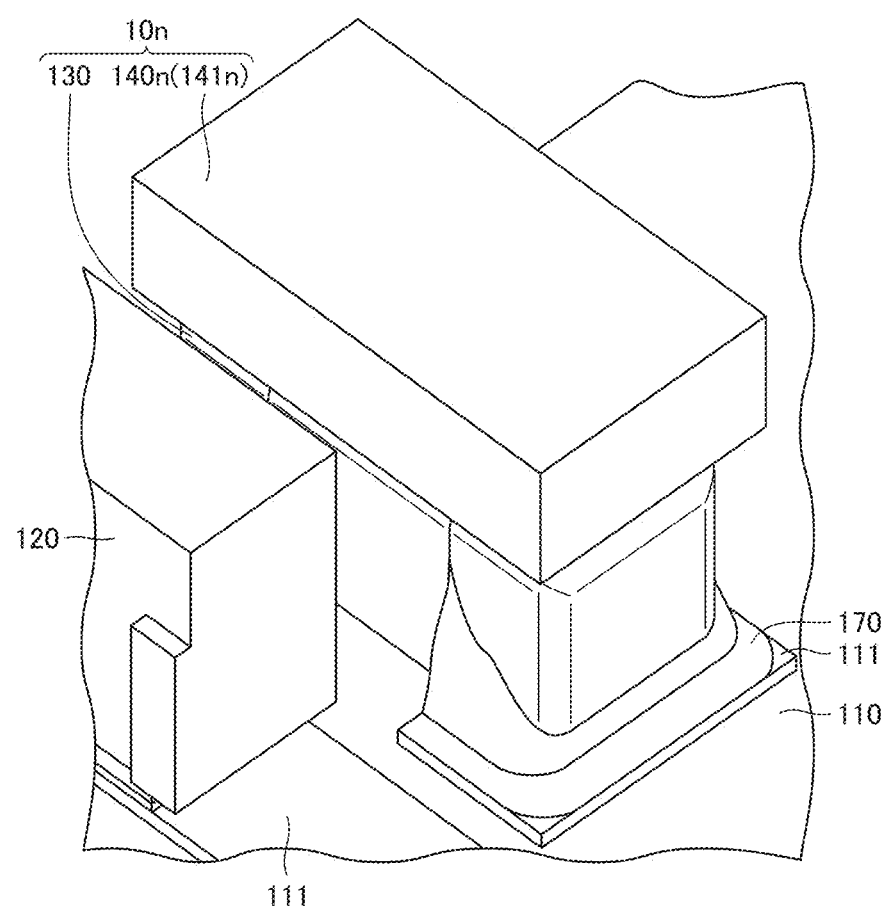
FIG. 34 is a perspective view showing a configuration of an electronic component unit according to a fourteenth variation of a preferred embodiment of the present invention.
Figure 35:
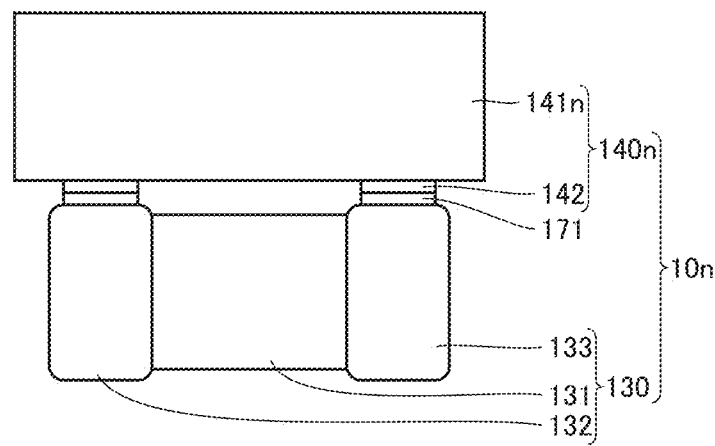
FIG. 35 is a front view showing a configuration of the electronic component unit according to the fourteenth variation of a preferred embodiment of the present invention.

FIG. 34 is a perspective view showing a configuration of an electronic component unit in a fourteenth variation. FIG. 35 is a front view showing a configuration of the electronic component unit in the fourteenth variation. FIG. 34 is a view shown in the same direction as FIG. 12.

As shown in FIGS. 34 and 35, in an electronic component unit 10n in the fourteenth variation, a heat transfer portion 140n is connected to both first and second terminal electrodes 132 and 133 via electrically conductive joint portions 171 such that first and second terminal electrodes 132 and 133 of second electronic component 130 are electrically insulated from each other.

Heat transfer portion 140n is different from heat transfer portion 140a in the first variation only in that a highly thermally conductive member 141n is greater than second electronic component 130 in length and width. Heat transfer portion 140n is disposed such that, as seen in a direction orthogonal or substantially orthogonal to board 110, second electronic component 130 is located inside heat transfer portion 140n.

In electronic component unit 10n in the fourteenth variation, since heat transfer portion 140n is disposed such that second electronic component 130 is located inside heat transfer portion 140n as seen in the direction orthogonal or substantially orthogonal to board 110, short circuits can be prevented that would otherwise be caused if second electronic component 130 came into contact with an electronic component adjacent to electronic component unit 10n.

Figure 36:
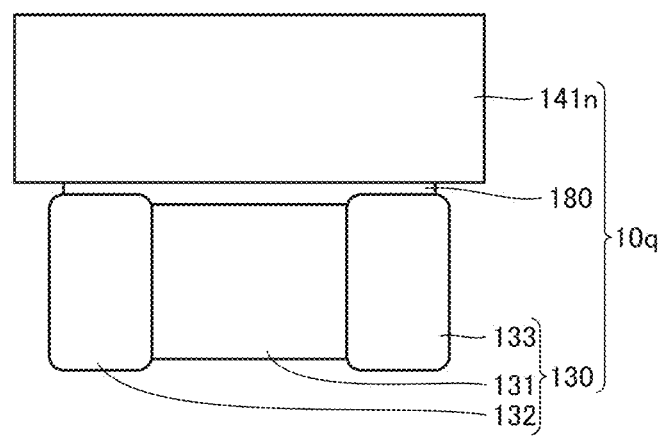
FIG. 36 is a front view showing a configuration of an electronic component unit according to a fifteenth variation of a preferred embodiment of the present invention.

FIG. 36 is a front view showing a configuration of an electronic component unit in a fifteenth variation. As shown in FIG. 36, in an electronic component unit 10q in the fifteenth variation, highly thermally conductive member 141n (i.e., a heat transfer portion) is connected to both first and second terminal electrodes 132 and 133 via adhesion layer 180 such that first and second terminal electrodes 132 and 133 of second electronic component 130 are electrically insulated from each other.

In electronic component unit 10q in the fifteenth variation, highly thermally conductive member 141n (i.e., a heat transfer portion) is disposed such that, as seen in the direction orthogonal or substantially orthogonal to board 110, second electronic component 130 is located inside heat transfer portion 140n. Accordingly, short circuits can be prevented that would otherwise be caused if second electronic component 130 came into contact with an electronic component adjacent to electronic component unit 10q.

Figure 37:
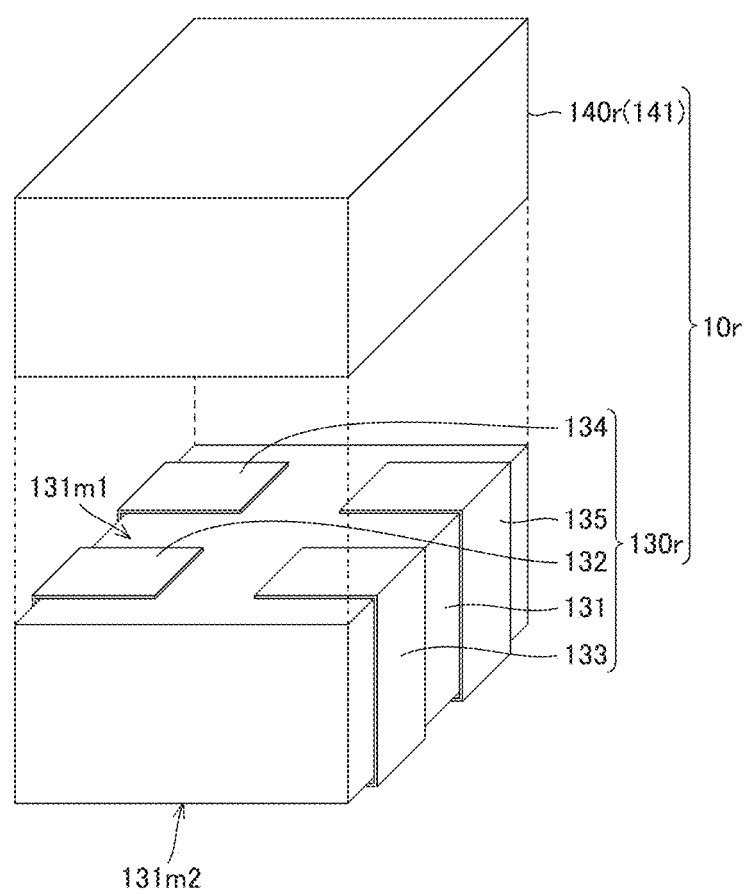
FIG. 37 is an exploded perspective view showing a configuration of an electronic component unit according to a sixteenth variation of a preferred embodiment of the present invention as seen from the heat transfer portion side.
Figure 38:
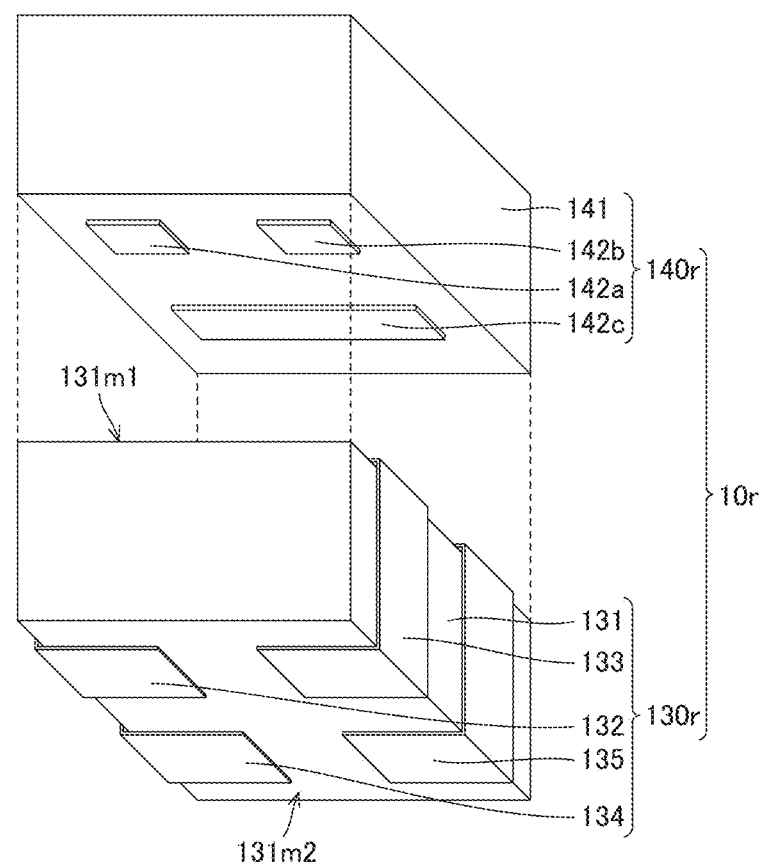
FIG. 38 is an exploded perspective view showing a configuration of the electronic component unit according to the sixteenth variation of a preferred embodiment of the present invention as seen from the second electronic component side.

FIG. 37 is an exploded perspective view showing a configuration of an electronic component unit in a sixteenth variation as seen from the heat transfer portion side. FIG. 38 is an exploded perspective view showing a configuration of the electronic component unit in the sixteenth variation as seen from the second electronic component side.

As shown in FIGS. 37 and 38, an electronic component unit 10r in the sixteenth variation includes a second electronic component 130r and a heat transfer portion 140r.

Second electronic component 130r is a passive component. Second electronic component 130r is preferably, for example, an LC filter. Second electronic component 130r includes body 131, first terminal electrode 132, second terminal electrode 133, a first GND terminal 134, and a second GND terminal 135.

First and second terminal electrodes 132 and 133 and first and second GND terminals 134 and 135 extend continuously from first surface 131m1 to second surface 131m2. First terminal electrode 132 and first GND terminal 134 extend continuously from first surface 131m1 to second surface 131m2 through one lateral face of body 131. Second terminal electrode 133 and second GND terminal 135 extend continuously from first surface 131m1 to second surface 131m2 through the other lateral face of body 131.

Heat transfer portion 140r includes highly thermally conductive member 141 defined by an insulating flat plate, and first, second, and third connection electrodes 142a, 142b and 142c provided on the surface of highly thermally conductive member 141 on the second electronic component 130 side.

In electronic component unit 10r in the sixteenth variation, heat transfer portion 140r is connected to both first and second terminal electrodes 132 and 133 via electrically conductive joint portions (not shown) such that first and second terminal electrodes 132 and 133 of second electronic component 130r are electrically insulated from each other.

Specifically, first connection electrode 142a is connected to first terminal electrode 132, second connection electrode 142b is connected to second terminal electrode 133, and third connection electrode 142c is connected to both first and second GND terminals 134 and 135.

Electronic component unit 10r in the sixteenth variation enables heat to transfer to heat transfer portion 140r through first and second terminal electrodes 132, 133 and through first and second GND terminals 134, 135. That is, electronic component unit 10r has an increased number of heat transfer paths, thus improving its thermal conductivity.

Preferred Embodiment 2

An electronic component module according to a preferred embodiment 2 of the present invention will now be described with reference to FIG. 39. The electronic component module according to preferred embodiment 2 of the present invention is different from electronic component module 100c in the third variation of preferred embodiment 1 of the present invention mainly in that, according to preferred embodiment 2, the heat dissipation portion is defined by wiring patterns on and/or inside a mother board. For the configuration similar to that of electronic component module 100c in the third variation of preferred embodiment 1 of the present invention, the description is not repeated.

Figure 39:
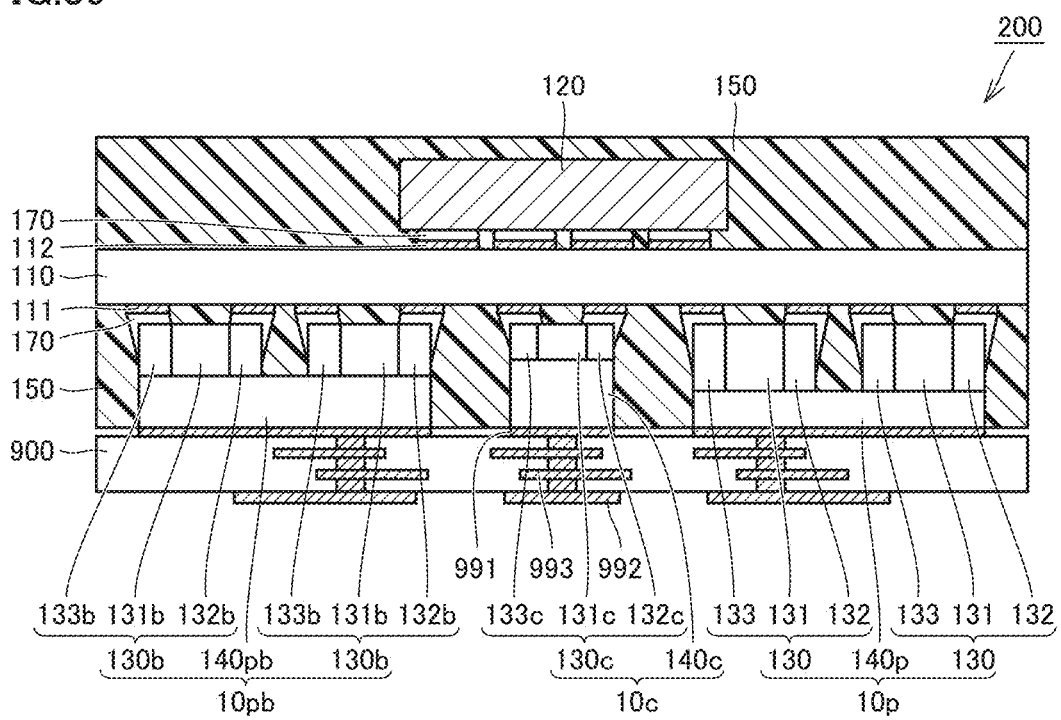
FIG. 39 is a cross-sectional view showing a configuration of an electronic component module according to a preferred embodiment 2 of the present invention.

FIG. 39 is a cross-sectional view showing a configuration of an electronic component module according to preferred embodiment 2 of the present invention. FIG. 39 shows a cross section taken at the same position as FIG. 2.

As shown in FIG. 39, in an electronic component module 200 according to preferred embodiment 2 of the present invention, the heat dissipation portion is defined by wiring patterns 991, 992, 993 disposed at least one of on a surface of and inside a mother board 900 on which electronic component module 200 is disposed. Specifically, wiring pattern 991 is disposed on one main surface of mother board 900. Wiring pattern 992 is disposed on the other main surface of mother board 900. Wiring pattern 993 is disposed inside mother board 900.

Wiring pattern 991 is connected to heat transfer portions 140c, 140p, 140pb via joining material (not shown).

Electronic component module 200 according to preferred embodiment 2 of the present invention enables the heat generated by first electronic component 120 to transfer through board 110 mainly to any of electronic component units 10c, 10p, 10pb that overlaps with first electronic component 120. The heat that has transferred to any of electronic component units 10c, 10p, 10pb is transferred to and dissipated through wiring patterns 991, 992, 993, which defines and functions as a heat dissipation portion. Thus, the heat generated by first electronic component 120 can be effectively dissipated.

Some of the features in the above-described preferred embodiments may be combined where possible.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component module comprising:
    a board;
    a first electronic component mounted on the board, the first electronic component being a heating element;
    a second electronic component including:
        a body including a first surface and a second surface on an opposite side from the first surface;
        a first terminal electrode extending continuously from the first surface to the second surface; and
        a second terminal electrode extending continuously from the first surface to the second surface and independent of the first terminal electrode in terms of potential; wherein
    the second electronic component is mounted on the board, with the first surface facing the board;
    a heat transfer portion is disposed on the second surface of the second electronic component, the heat transfer portion being connected to both the first terminal electrode and the second terminal electrode, with the first terminal electrode and the second terminal electrode being maintained independent of each other in terms of potential; and
    a heat dissipation portion is connected to the board via the first terminal electrode, the second terminal electrode, and the heat transfer portion.

2. The electronic component module according to claim 1, further comprising:
    a resin portion disposed on the board, with the first electronic component and the second electronic component being embedded in the resin portion; wherein
    the heat transfer portion includes a thermally conductive member higher in thermal conductivity than the resin portion; and
    the heat dissipation portion is higher in thermal conductivity than the resin portion.

3. The electronic component module according to claim 1, wherein the first electronic component and the second electronic component are mounted on one main surface of the board.

4. The electronic component module according to claim 1, wherein
    the second electronic component is mounted on one main surface of the board; and
    the first electronic component is mounted on another main surface of the board.

5. The electronic component module according to claim 1, wherein the first electronic component and the second electronic component are electrically connected to each other via a wiring pattern disposed at at least one of on a surface of and inside the board.

6. The electronic component module according to claim 1, wherein
    the first electronic component is an active component; and
    the second electronic component is a passive component.

7. The electronic component module according to claim 6, wherein the second electronic component is a multilayer ceramic capacitor.

8. The electronic component module according to claim 1, wherein the heat transfer portion is in contact with the first terminal electrode, the second terminal electrode, and a portion of the body that is located between the first terminal electrode and the second terminal electrode, on a side of the second surface of the second electronic component.

9. The electronic component module according to claim 2, wherein the thermally conductive member is defined by an insulating flat plate and connected to the first terminal electrode and the second terminal electrode via an adhesion layer.

10. The electronic component module according to claim 2, wherein the thermally conductive member is defined by a metallic flat plate and connected to the first terminal electrode and the second terminal electrode via an insulating adhesion layer.

11. The electronic component module according to claim 1, wherein the heat dissipation portion is made of an electrically conductive film.

12. The electronic component module according to claim 1, wherein the heat dissipation portion is made of a wiring pattern disposed at at least one of on a surface of and inside a mother board on which the electronic component module is provided.

13. The electronic component module according to claim 1, wherein
    the second electronic component includes a plurality of second electronic components; and
    two or more of the plurality of second electronic components are connected to one heat transfer portion at the first terminal electrode and the second terminal electrode.

14. An electronic component unit comprising:
    an electronic component including:
        a body including a first surface and a second surface on an opposite side from the first surface;

a first terminal electrode extending continuously from the first surface to the second surface; and a second terminal electrode extending continuously from the first surface to the second surface and independent of the first terminal electrode in terms of potential; and a heat transfer portion disposed on the second surface of the electronic component, the heat transfer portion being connected to both the first terminal electrode and the second terminal electrode, with the first terminal electrode and the second terminal electrode being maintained independent of each other in terms of potential.

15. A method for manufacturing an electronic component module, the method comprising:

mounting a first electronic component on a board, the first electronic component being a heating element;

mounting a second electronic component on the board, the second electronic component including:

a body including a first surface and a second surface on an opposite side from the first surface;

a first terminal electrode extending continuously from the first surface to the second surface; and a second terminal electrode extending continuously from the first surface to the second surface and independent of the first terminal electrode in terms of potential;

the second electronic component including a heat transfer portion on the second surface, the heat transfer portion being connected to both the first terminal electrode and the second terminal electrode, with the first terminal electrode and the second terminal electrode being maintained independent of each other in terms of potential;

the second electronic component being mounted on the board, with the first surface facing the board; and producing a heat dissipation portion connected to the board via the first terminal electrode, the second terminal electrode, and the heat transfer portion.

16. The method for manufacturing an electronic component module according to claim 15, further comprising:

producing a resin portion such that the first electronic component and the second electronic component are embedded in the resin portion, after the mounting of the first electronic component on the board and the mounting of the second electronic component on the board.

17. The method for manufacturing an electronic component module according to claim 16, wherein the producing of the resin portion includes providing the resin portion greater in height than the heat transfer portion, and grinding the resin portion and a portion of the heat transfer portion, such that the heat transfer portion is exposed at a surface of the resin portion.

18. The method for manufacturing an electronic component module according to claim 15, wherein the first electronic component and the second electronic component are mounted on one main surface of the board.

19. The method for manufacturing an electronic component module according to claim 15, wherein the second electronic component is mounted on one main surface of the board; and the first electronic component is mounted on another main surface of the board.

20. The method for manufacturing an electronic component module according to claim 15, wherein the first electronic component and the second electronic component are electrically connected to each other via a wiring pattern disposed at at least one of on a surface of and inside the board.

* * * * *